(12) United States Patent
Dickson

(10) Patent No.: US 7,093,182 B2
(45) Date of Patent: *Aug. 15, 2006

(54) DATA REDUNDANCY METHODS AND APPARATUS

(75) Inventor: Lawrence John Dickson, Boulevard, CA (US)

(73) Assignee: Inostor Corporation, Poway, CA (US)

( * ) Notice: Subject to any disclaimer, the term of this patent is extended or adjusted under 35 U.S.C. 154(b) by 366 days.

This patent is subject to a terminal disclaimer.

(21) Appl. No.: 10/371,628

(22) Filed: Feb. 20, 2003

(65) Prior Publication Data

US 2003/0196023 A1    Oct. 16, 2003

Related U.S. Application Data

(63) Continuation-in-part of application No. 09/366,222, filed on Aug. 2, 1999, now Pat. No. 6,557,123.

(51) Int. Cl.
*G11C 29/00* (2006.01)

(52) U.S. Cl. .......................... 714/770; 714/746; 714/6; 711/114; 719/325

(58) Field of Classification Search ................ 714/762, 714/770, 804, 800, 701; 711/114; 719/325
See application file for complete search history.

(56) References Cited

U.S. PATENT DOCUMENTS

| | | | | |
|---|---|---|---|---|
| 4,775,978 A | * | 10/1988 | Hartness | 714/770 |
| 5,077,736 A | * | 12/1991 | Dunphy et al. | 714/7 |
| 5,333,143 A | * | 7/1994 | Blaum et al. | 714/766 |
| 5,463,643 A | * | 10/1995 | Gaskins et al. | 714/766 |
| 5,485,571 A | * | 1/1996 | Menon | 714/7 |
| 5,579,475 A | * | 11/1996 | Blaum et al. | 714/7 |
| 5,581,724 A | * | 12/1996 | Belsan et al. | 711/114 |
| 6,269,424 B1 | * | 7/2001 | Katsuragi et al. | 711/114 |
| 6,445,717 B1 | * | 9/2002 | Gibson et al. | 370/473 |

* cited by examiner

*Primary Examiner*—Albert Decady
*Assistant Examiner*—John P. Trimmings
(74) *Attorney, Agent, or Firm*—Ying Chen

(57) ABSTRACT

Method and apparatus for providing data recovery in a one or multiple disk loss situation in a RAID5 like system. A data storage apparatus has a plurality of n disks storing data comprising a plurality of n data groupings stored across the plurality of n disks. Each one of the n data groupings comprises a data portion and a redundancy portion. The size of the data portion relative to the redundancy portion is as H to Q, where H/Q<(n−m)/m, where m is the maximum number of disks that may be lost at any given time. Advantageously, the n data portions are recoverable from any and all combinations of n−m data grouping(s) on n−m disk(s) when the other m data grouping(s) are unavailable, where $1 \leq m < n$.

43 Claims, 33 Drawing Sheets

REDUNDANCY DATA GENERATION FUNCTION MATRIX FOR m=2, n=5, H=1, Q=1

| | A1 | B1 | C1 | D1 | E1 | |
|---|---|---|---|---|---|---|
| A' | | • | | | • | A' = B1 (+) E1 |
| B' | • | | • | | | B' = A1 (+) C1 |
| C' | | • | | • | | C' = B1 (+) D1 |
| D' | | | • | | • | D' = C1 (+) E1 |
| E' | • | | | • | | E' = A1 (+) D1 |

FIG. 9

REDUNDANCY DATA GENERATION FUNCTION MATRIX FOR m=2, n=5, H=1, Q=1

DECODING FUNCTION MATRIX FOR DISKS A AND B MISSING
SURVIVING: C1, D1, E1, C', D', E'

|    | A1 | B1 | C1 | D1 | E1 | C' | D' | E' |
|----|----|----|----|----|----|----|----|----|
|    |    | •  |    |    |    |    |    |    |
|    |    |    | •  |    |    |    |    |    |
|    |    |    |    | •  |    |    |    |    |
|    |    |    |    |    | •  |    |    |    |
|    |    |    |    |    |    | •  |    |    |
|    |    |    |    |    |    |    | •  |    |
|    |    |    |    |    |    |    |    | •  |
|    | •  |    |    |    |    |    |    |    |

⇓ ⇓ ⇓

SOLVED DECODING FUNCTION MATRIX FOR DISKS A AND B MISSING

|    | A1 | B1 | C1 | D1 | E1 | C' | D' | E' |
|----|----|----|----|----|----|----|----|----|
|    | •  |    |    | •  |    |    |    | •  |
|    |    | •  |    | •  |    | •  |    |    |
|    |    |    | •  |    | •  |    | •  |    |

COMPLETE DECODING FUNCTIONS FOR DISKS A AND B MISSING

| FIG. 11A |
| FIG. 11B |

REDUNDANCY DATA GENERATION FUNCTION MATRIX FOR m=2, n=5, H=1, Q=1

| | A1 | B1 | C1 | D1 | E1 | |
|---|---|---|---|---|---|---|
| A' | | • | | | • | A' = B1 (+) E1 |
| B' | ⊙ | | ⊙ | | | B' = A1 (+) C1 |
| C' | | • | | • | | C' = B1 (+) D1 |
| D' | | | ⊙ | | ⊙ | D' = C1 (+) E1 |
| E' | ⊙ | | | ⊙ | | E' = A1 (+) D1 |

DECODING FUNCTION MATRIX FOR DISKS A AND C MISSING
SURVIVING: B1, D1, E1, B', D', E'

|    | A1 | B1 | C1 | D1 | E1 | B' | D' | E' |
|----|----|----|----|----|----|----|----|----|
|    | •  | —  | •  | —  | —  | —  | —  | —  |
|    | —  | —  | •  | •  | —  | —  | —  | •  |
|    | —  | —  | —  | —  | •  | —  | •  | —  |
|    |    | ⇓  |    | ⇓  | ⇓  |    |    |    |

SOLVED DECODING FUNCTION MATRIX FOR DISKS A AND C MISSING

|    | A1 | B1 | C1 | D1 | E1 | B' | D' | E' |
|----|----|----|----|----|----|----|----|----|
|    | •  | —  | —  | •  | —  | —  | —  | •  |
|    | —  | —  | •  | •  | •  | —  | •  | •  |
|    | —  | —  | —  | •  | •  | —  | •  | •  |
|    |    | ⇓  |    | ⇓  | ⇓  |    |    |    |

COMPLETE DECODING FUNCTIONS FOR DISKS A AND C MISSING

DECODING FUNCTION MATRIX FOR DISKS A AND D MISSING
SURVIVING: B1, C1, E1, B', C', E'

| A1 | D1 | B1 | C1 | E1 | B' | C' | E' |
|---|---|---|---|---|---|---|---|
| • | • | | | | | | |
| | • | • | | | | • | |
| | • | | • | | | | • |
|   | ⇓ | ⇓ | ⇓ |   |   |   |   |

SOLVED DECODING FUNCTION MATRIX FOR DISKS A AND D MISSING

| A1 | D1 | B1 | C1 | E1 | B' | C' | E' |
|---|---|---|---|---|---|---|---|
| • | | | | | • | | |
| | • | | | | • | • | |
| | | • | • | | | • | • |
|   |   | ⇓ | ⇓ |   |   |   |   |

COMPLETE DECODING FUNCTIONS FOR DISKS A AND D MISSING

| | FIG. 13A |
| --- | --- |
| | FIG. 13B |

REDUNDANCY DATA GENERATION FUNCTION MATRIX FOR m=2, n=5, H=1, Q=1

| | A | B1 | C1 | D1 | E1 | |
| --- | --- | --- | --- | --- | --- | --- |
| A' | | • | | | • | A' = B1 (+) E1 |
| B' | ◉ | | • | | | B' = A1 (+) C1 |
| C' | | • | | ◉ | | C' = B1 (+) D1 |
| D' | | | • | | • | D' = C1 (+) E1 |
| E' | ◉ | | | ◉ | | E' = A1 (+) D1 |

DECODING FUNCTION MATRIX FOR DISKS A AND D MISSING
SURVIVING: B1, C1, E1, B', C', E'

|    | A1 | D1 | B1 | C1 | E1 |
|----|----|----|----|----|----|
| B' | •  | —  | •  | —  | —  |
| C' | —  | •  | —  | •  | —  |
| E' | •  | •  | —  | —  | —  |

⇩ ⇩ ⇩

REARRANGEMENT OF DECODING FUNCTION MATRIX FOR DISKS A AND D MISSING

|    | D1 | A1 | E1 | B1 | C1 |
|----|----|----|----|----|----|
| E' | •  | •  | —  | —  | —  |
| B' | —  | •  | —  | •  | —  |
| C' | •  | —  | —  | —  | •  |

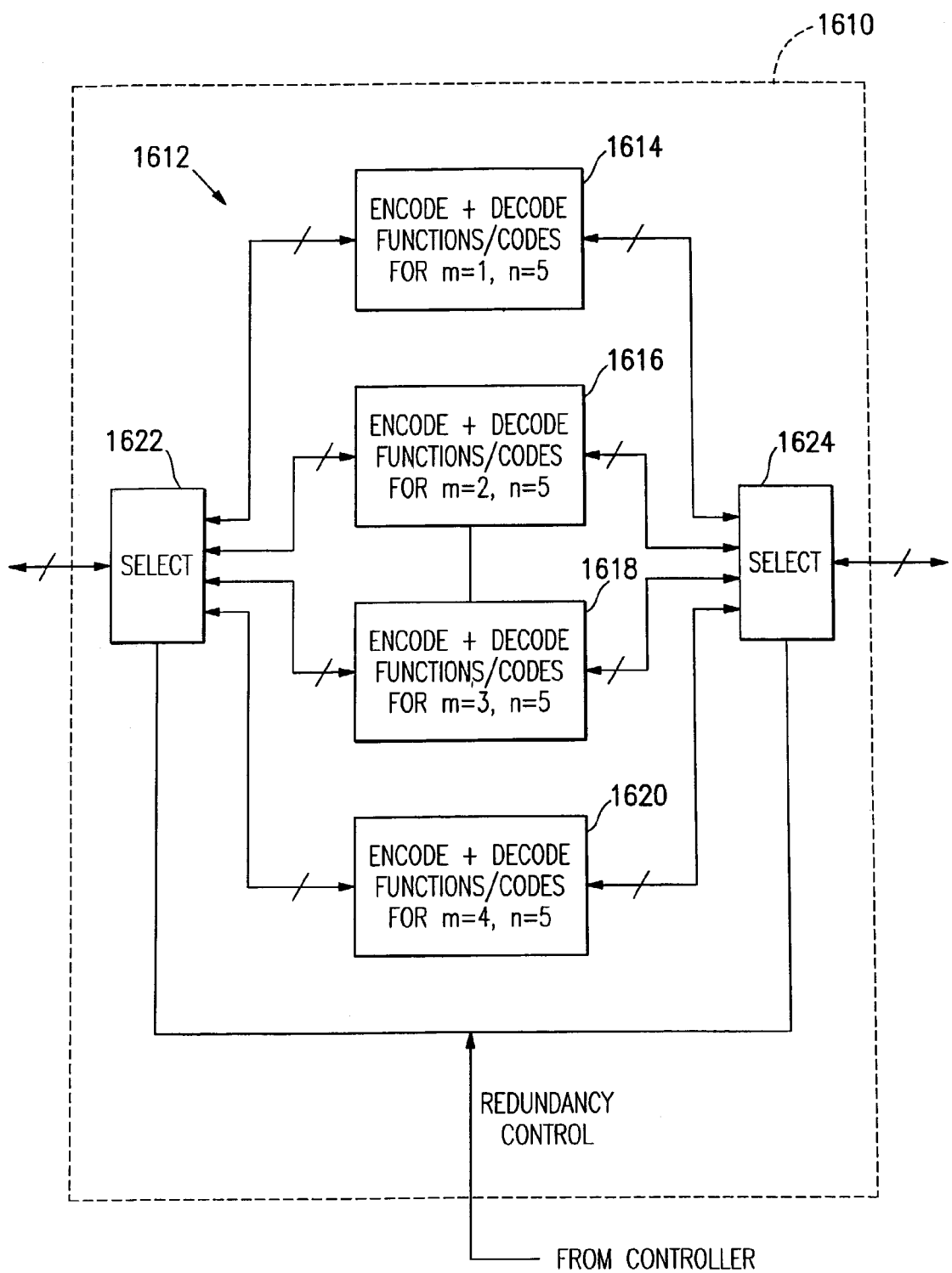
FIG. 16.1

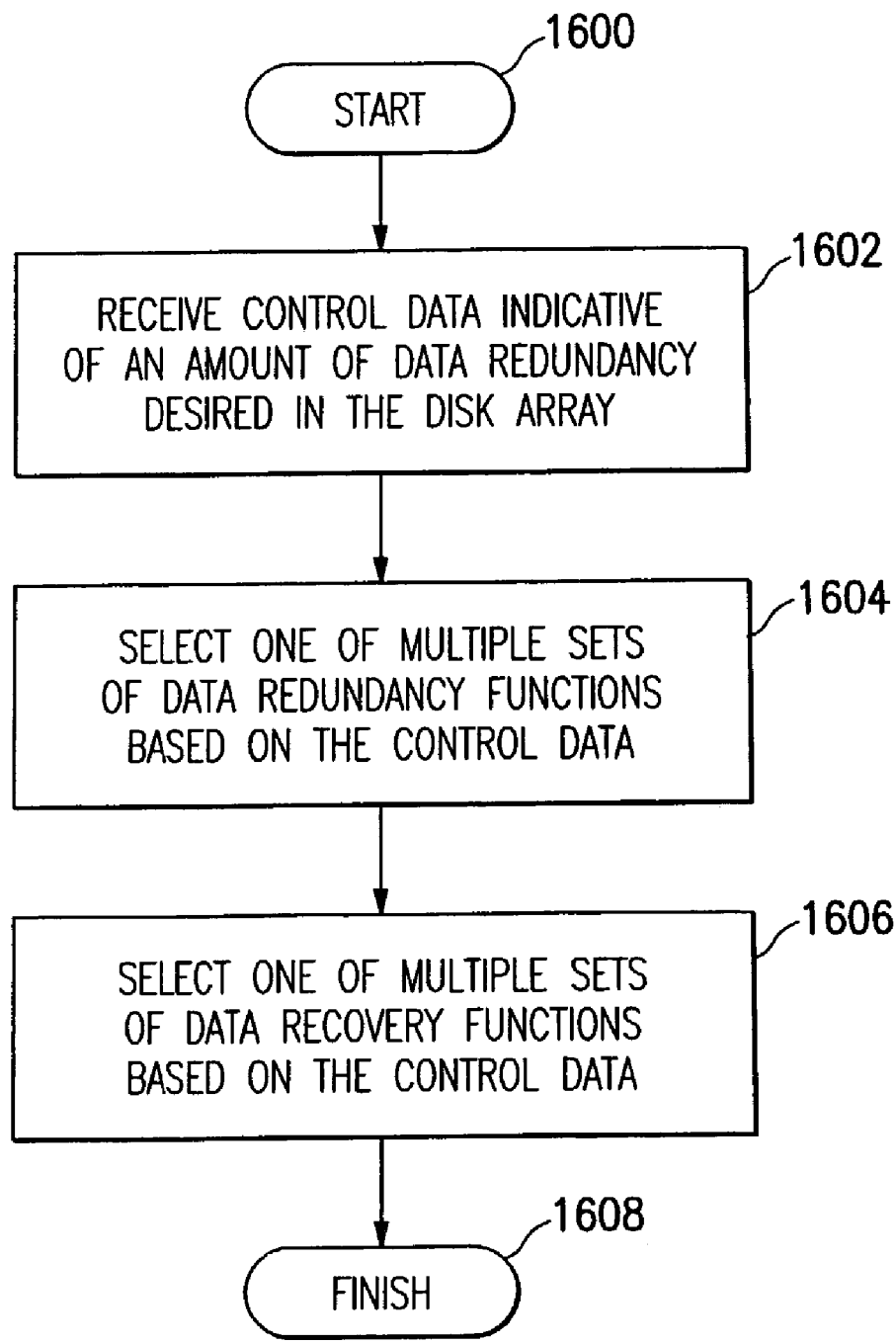
FIG. 16.2

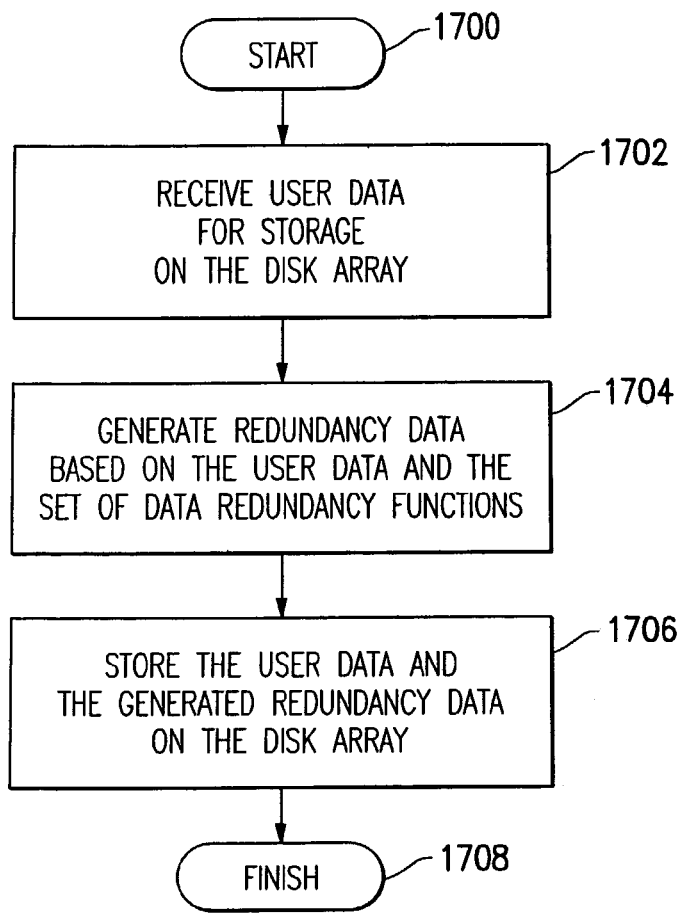
FIG. 17.1
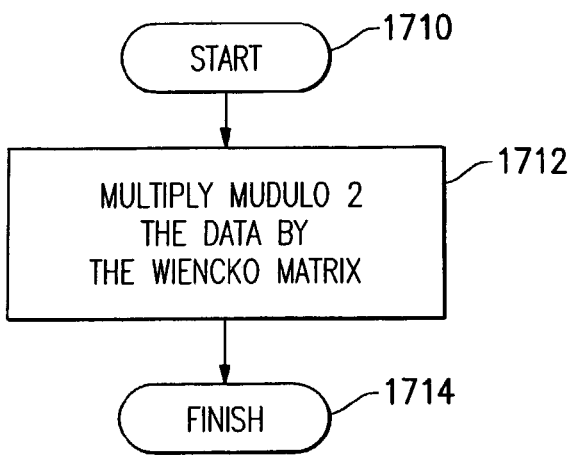
FIG. 17.2

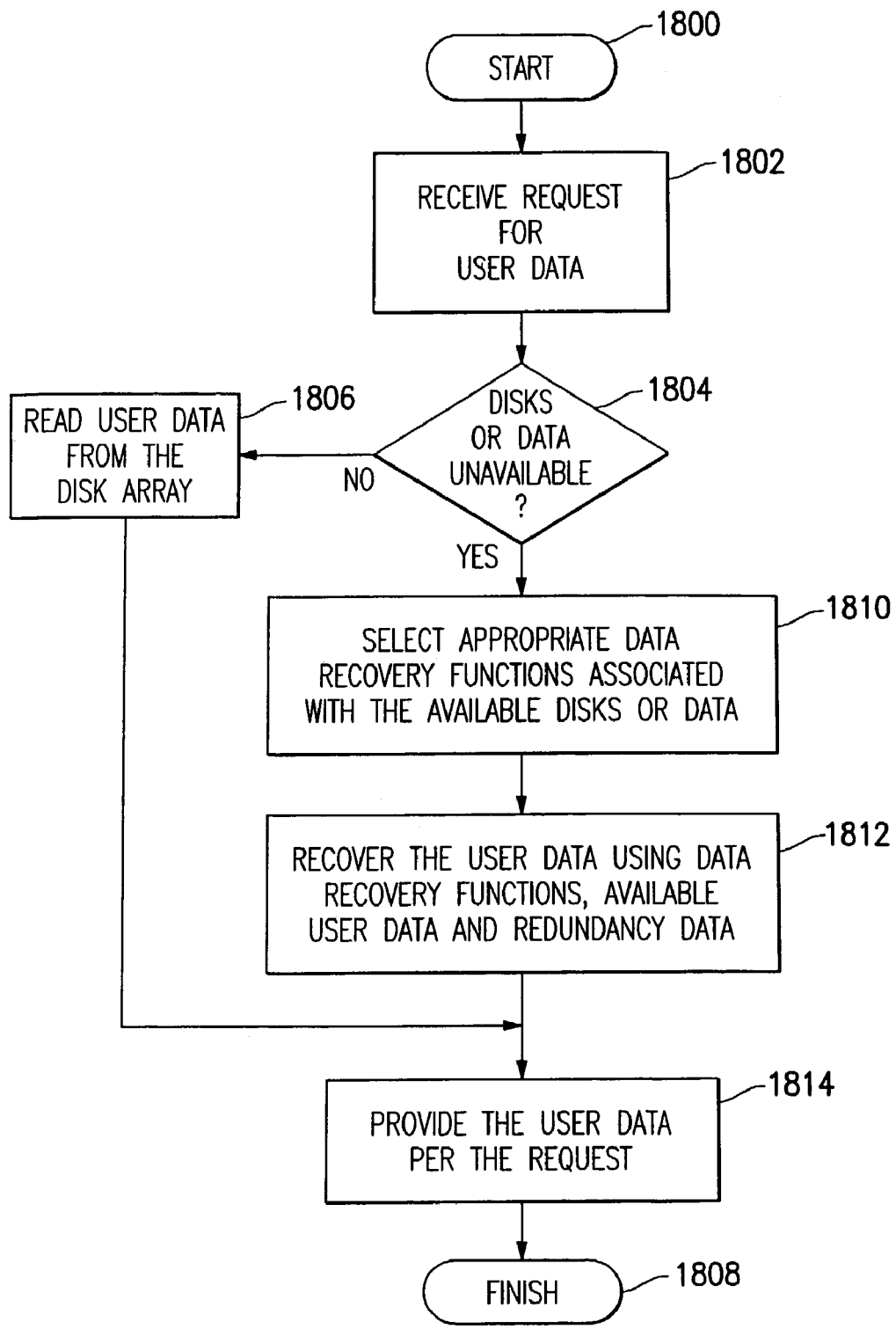
FIG. 18.1

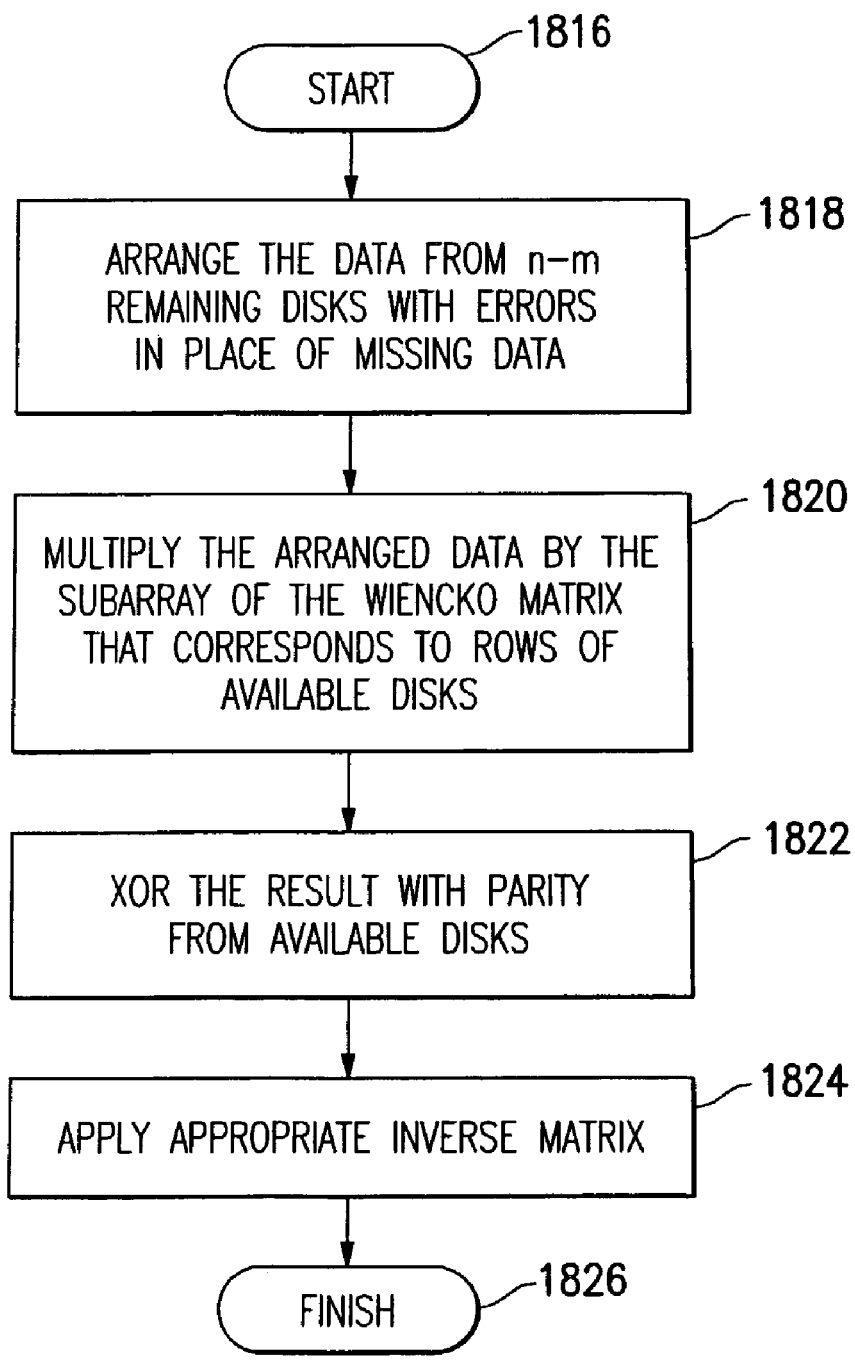
FIG. 18.2

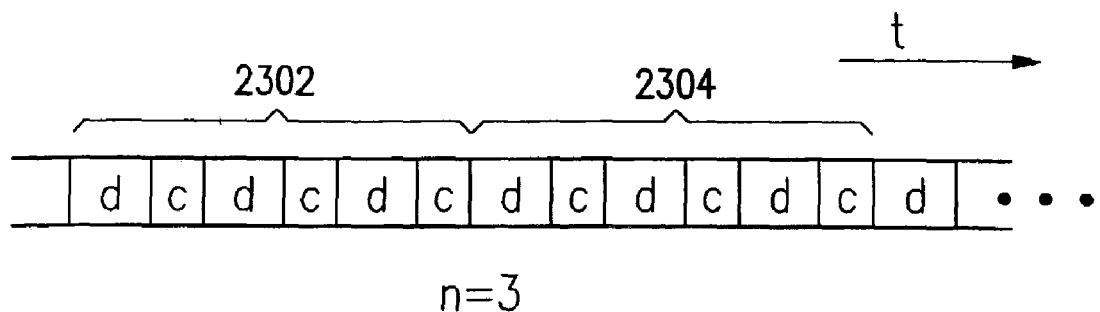
FIG. 23
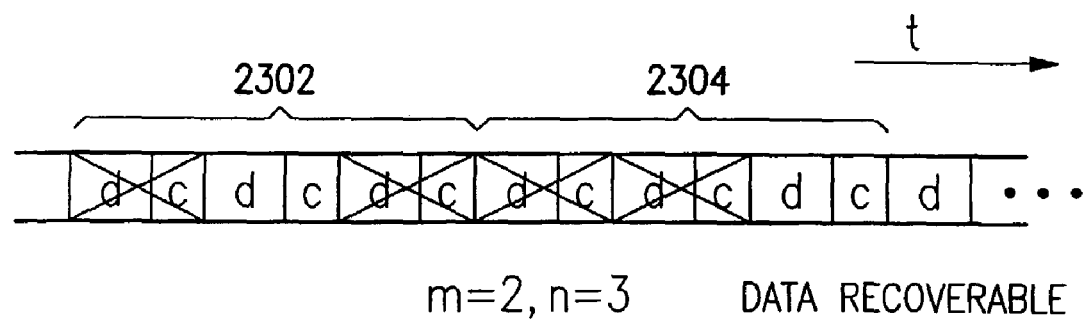
FIG. 24.1

FIG. 24.2

| SERVER | TIME DATA RCV'D | SELECTED SERVER? |
|---|---|---|
| A | 10 MSEC | YES |
| B | 25 MSEC | NO |
| C | 30 MSEC | NO |

TIME = 7:30 a.m.

| SERVER | TIME DATA RCV'D | SELECTED SERVER? |
|---|---|---|
| A | 50 MSEC | NO |
| B | 25 MSEC | YES |
| C | 30 MSEC | NO |

TIME = 8:30 a.m.

| SERVER | TIME DATA RCV'D | SELECTED SERVER? |
|---|---|---|
| A | 50 MSEC | NO |
| B | 50+25=75 MSEC | NO |
| C | 30 MSEC | YES |

TIME = 11:30 a.m.

EXAMPLE:
m=2,
n=5

DEFINING SUBARRAYS AND COMPOSITE SUBMATRICES FOR m=2, n=5
SUBARRAY DIMENSIONS = m×(n−m)= 2×3
OF COMPOSITE SUBMATRICES = n!/m!(n−m)! = 10

FIG. 34

DEFINING SUBARRAYS AND COMPOSITE SUBMATRICES FOR m=3, n=5
SUBARRAY DIMENSIONS = mx(n-m) = 3x2
OF COMPOSITE SUBMATRICES = n!/m!(n-m)! = 10

DEFINING SUBARRAYS AND COMPOSITE SUBMATRICES FOR m=4, n=5
SUBARRAY DIMENSIONS = mx(n−m) = 4x1
OF COMPOSITE SUBMATRICES = n!/m!(n−m)! = 5

DATA REDUNDANCY METHODS AND APPARATUS

RELATED APPLICATIONS

This application is a continuation-in-part of U.S. Patent Application Ser. No. 09/366,222, filed Aug. 2, 1999, now U.S. Pat. No. 6,557,123, which is herein incorporated by reference in its entirety.

INCORPORATION BY REFERENCE

Incorporated by reference herein are Appendix A and Appendix B, which are submitted on a compact disc and contain computer printouts and/or program listings. The compact disc contains the following files:

(1) Name of file: APNDXA.TXT; date of creation: Feb. 12, 2003; size: 3 KB;

(2) Name of file: DIFICUL.C; date of creation: Sep. 25, 2000; size: 8 KB;

(3) Name of file: MAKEFILE; date of creation: Feb. 19, 2003; size: 1 KB;

(4) Name of file: NEARW.C; date of creation: Oct. 11, 2001; size: 12 KB;

(5) Name of file: NEARW.COD; date of creation: Feb. 7, 2003; size: 5 KB;

(6) Name of file: NEARWLIB.C; date of creation: Oct. 11, 2001; size: 17 KB; and (7) Name of file: NEARWLIB.H; date of creation: Oct. 11, 2001; size: 5 KB.

File (1) constitutes Appendix A and files (2) through (7) constitute Appendix B.

BACKGROUND OF THE INVENTION

1. Field of the Invention

The present invention relates generally to data redundancy methods and apparatus. Various aspects relate more particularly to redundancy data generation, data restoration, data storage, redundancy adjustability, data communication, computer network operations, and code discovery techniques.

2. Description of the Related Art

With the explosive growth in the Internet and mission-critical applications, the importance of preserving data integrity and ensuring 24×7 continuous access to critical information cannot be overstated. Information is now recognized as a key organizational asset, essential to its operation and market competitiveness. Access to critical information on a continuous basis is a mandatory requirement for survival in the business world. Critical applications involving military operations, communications, audio-visual, medical diagnoses, ISP (Internet Service Provider) and Web sites, or financial activities, for example, depend upon the continuous availability of essential data.

Downtime is extremely costly. Customers, vendors, employees, and prospects can no longer conduct essential business or critical operations. There is a "lost opportunity" cost to storage failures as well in terms of business lost to competitors. Well-documented studies place the cost of downtime in the tens of thousands (or even millions) of dollars per hour.

The need for large amounts of reliable online storage is fueling demand for fault-tolerant technology. According to International Data Corporation, the market for disk storage systems last year grew by 12 percent, topping $27 billion. More telling than that figure, however, is the growth in capacity being shipped, which grew 103 percent in 1998. Much of this explosive growth can be attributed to the space-eating demands of endeavors such as year 2000 testing, installation of data-heavy enterprise resource planning applications and the deployment of widespread Internet access.

Disk drive manufacturers publish Mean Time Between Failure (MTBF) figures as high as 800,000 hours (91 years). However, the claims are mostly unrealistic when examined. The actual practical life of a disk drive is 5 to 7 years of continuous use. Many Information Technology managers are aware that disk drives fail with great frequency. This is the most likely reason why companies place emphasis on periodic storage backup, and why there is such a large market for tape systems.

The industry answer to help satisfy these needs has been the use of conventional RAID ("Redundant Arrays of Inexpensive Disks") storage. In general, RAID storage reduces the risk of data loss by either replicating critical information on separate disk drives, or spreading it over several drives with a means of reconstructing information if a single drive is lost.

There are basically four elements of RAID: 1) mirroring data (i.e., creating an exact copy every time information is written to storage), 2) performing checksum calculations (parity data), 3) striping information in equal-sized pieces across multiple drives, and 4) having a standby hot spare should one drive fail. Some methods use a combination of both approaches. RAID storage systems are usually designed with redundant power supplies and the ability to swap out failed drives, power supplies and fans while the system continues to operate. Sophisticated RAID systems even contain redundant controllers to share the workload and provide automatic fail-over capabilities should one malfunction.

Conventional RAID storage configurations have proven to be the best hedge against the possibility of a single drive failure within an array. If more than one drive in a RAID array fails, however, or a service person accidentally removes the wrong drive when attempting to replace a failed drive, the entire RAID storage system becomes inoperable. And the likelihood of multiple drive failures in large disk arrays is significant. The resultant cost of inaccessibility to mission-critical information can be devastating in terms of lost opportunity, lost productivity and lost customers.

Accidents can contribute to multiple drive failures in RAID storage. Service personnel have been known to remove the wrong drive during a replacement operation, crashing an entire RAID storage system. In poorly engineered RAID systems, replacing a failed drive can sometimes create a power glitch, damaging other drives. General data center administrative and service operations also present opportunities for personnel to inadvertently disable a drive.

It is well known that the likelihood of a drive failure increases as more drives are added to a disk RAID storage system. The larger the RAID storage system (i.e., the more disk drives it has), the greater the chance that two or more drives could become inoperable at one time. Here, the term "time" means the duration from the instant when a drive fails until it is replaced and data/parity information is recovered. In remote locations, during holidays, or even during graveyard shifts, the "time" to drive recovery could be several hours. Thus, multiple drive failures do not have to occur at exactly the same instant in order to have a devastating effect on mission-critical storage.

Given the plausible assumptions that drives fail independently at random times with a certain MTBF, and that they stay down a certain time after failing, the following conclusions may be drawn for large arrays of disks: (1) the frequency of single drive failure increases linearly as the number of disks n; (2) the frequency of two drives failing together (a second failing before the first is reconstructed) increases as n*(n−1), or almost as the square of the number of disks; (3) the frequency of three drives failing together increases as n(n−1)(n−2) or almost as the cube; and so forth.

The multiple failures, though still less frequent than single disk failure, become rapidly more important as the number of disks in a RAID becomes large. The following table illustrates the behavior of one, two and three drive failure MTBFs given that single drive MTBF divided by downtime is very much greater than the number of drives:

| # of Drives | 1 | 2 | 3 | 4 | 5 | 10 | 15 | 20 |
|---|---|---|---|---|---|---|---|---|
| MTBF | a | a/2 | a/3 | a/4 | a/5 | a/10 | a/15 | a/20 |
| MTB2F | — | b | b/3 | b/6 | b/10 | b/45 | b/105 | b/190 |
| MTB3F | — | — | c | c/4 | c/10 | c/120 | c/455 | c/1140 |

Here a<<b<<c are mean time constants for a failure of one disk, a coincidental failure of two disks, and a coincidental failure of three disks, respectively. If one-disk MTBF is five 360-day years and downtime is one day, then a=5 years, b=4,500 years, and c=5,400,000 years. If MTBF is reduced to 1 year and downtime increased to two days, then a=1 year, b=90 years, and c=10,800 years.

The consequences of a multiple-drive failure can be devastating. Typically, if more than one drive fails, or a service person accidentally removes the wrong drive when attempting to replace a failed drive, the entire RAID storage system is out of commission. Access to critical information is not possible until the RAID system is re-configured, tested and a backup copy restored. Transactions and information written since the last backup may be lost forever.

Thus, the possibility of a multiple-drive failure is very high for mission-critical applications that run 24-hours daily on a continuous basis. Moreover, the larger a RAID storage system, the greater the potential of suffering multiple-drive failures. And the chances increase significantly for remote locations where the response time to replace a failed drive can extend to several hours or even days.

Conventional RAID levels have their advantages and disadvantages. While RAID-0 delivers high performance, it cannot sustain even a single drive failure because there is no parity information or data redundancy. Although the most costly, mirroring data on separate drives (RAID-1), means that if one drive fails, critical information can still be accessed from the mirrored drive. Typically, RAID-1 involves replicating all data on two separate "stacks" of disk drives on separate SCSI channels, incurring the cost of twice as many disk drives. There is a performance impact as well, since data must be written twice, consuming both RAID system and possibly server resources. RAID-3 and RAID-5 allow continued (albeit degraded) operation by reconstructing lost information "on the fly" through parity checksum calculations. Adding a global hot spare provides the ability to perform a background rebuild of lost data.

With the exception of costly RAID-1 (or combinations of RAID-1 with RAID-0 or RAID-5) configurations, there have been few solutions for recovering from a multiple drive failure within a RAID storage system. Even the exceptions sustain multiple drive failures only under very limited circumstances. For example, a RAID-1 configuration can lose multiple (or all) drives in one mirrored stack as long as not more than one drive fails in its mirrored partner. Combining striping and parity within mirrored stacks buys some additional capabilities, but is still subject to these drive-failure limitations.

Some variations of RAID are based merely on combinations of RAID levels, described below in terms of basic structure and performance (0+1 array, 5+1 array, and 5+5 array). All of the packs described in the following configurations are assumed to have pattern designs that maximize read and write speed for large files and parallel data flows to and from disks. The "ideal" speeds will be based on raw data movement only, ignoring buffering and computational burdens: In a "0+1" array, two striped arrays of five disks each mirror the other. A striped array (RAID-0) is lost if only one of its disks is lost, so the safe loss count=1 and maximum loss count=5 (depending whether disks lost are on same side of mirror). Data capacity=5, read speed=10 (using an operating system capable of alternating mirror reads to achieve full parallelism; the usual max is 5) and write speed=5 (here reading assumes a strategy of alternating between sides of the mirror to increase the parallelism). In a "5+1" array, two RAID-5 arrays of five disks each mirror each other. Safe loss count is 3 (when one side has lost no more than one disk, the other perhaps more, we can still recover), max loss count is 6 (one entire side, and one disk from the other side). Data capacity is 4 (equals that of one RAID-5 array), read speed=10 but usual max is 5 (see above discussion of "0+1"), and write speed=4 (using full parallelism, but with parity and mirror burdens). Similar results arise from a 1+5 array (a RAID-5 made of mirrored pairs). In a "5+5" array, three RAID-5 arrays of three disks each form a RAID-5 with respect to each other. Thus one entire array of three can be lost, plus one disk of each of the other two. This implies safe loss count=3 (it can't tolerate a 0–2–2 loss pattern) and max loss count=5. Data capacity is 4 (of 9), read speed is 9 (using nested striping) and write speed is 4.

Other RAID-like variations exist, but with their downsides. A highly complex encryption-type multiple redundancy algorithm exists, referred to as the Mariani algorithm (downloaded file "raidzz" and related files). The form of RAID described by Mariani can either be applied to dedicated parity disks or have rotation superimposed (as with the two patents referred to below), and additionally requires encryption, which does not treat every bit in a chunk identically. In addition, the subject matter in U.S. Pat. No. 5,271,012 ("Method and Means for Encoding and Rebuilding Data Contents of up to Two Unavailable DASDs in an Array of DASDS" and in U.S. Pat. No. 5,333,143 ("Method and Means for B-Adjacent Coding and Rebuilding Data from up to Two Unavailable DASDs in a DASD Array") address multiple failures, but are limited. The form of RAID described in these patents generates two parity stripes as a function of n−2 data stripes. The two parity stripes (on two of the disks) are all parity; the n−2 data stripes (on n−2 of the disks) are all data. This leads to read inefficiency unless a rotation structure is superimposed on the formula, in which case it leads to algorithmic inefficiency.

Accordingly, what is needed are methods and apparatus that overcome these and other deficiencies of the prior art.

SUMMARY OF THE INVENTION

An aspect of the invention is a method for controlling a data storage apparatus including a plurality of n storage devices, the method including selecting a control value m indicative of a degree of data redundancy, m being an integer variable from 1 to n−1 inclusive; logically configuring each storage device into one or more stripes, each stripe including H data portions for storing user data and Q data redundancy portions for storing redundancy data, H and Q being positive integers and H/Q<(n−m)/m; and providing a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and the redundancy data stored in n−m remaining storage devices using the data recovery functions.

Another aspect of the invention is a method for controlling a data storage apparatus comprising a plurality of n storage devices, the method including logically configuring each storage device into one or more stripes, each stripe including H data portions for storing user data and Q data redundancy portions for storing redundancy data, H and Q being positive integers and H/Q<(n−m)/m, wherein m is a control value indicative of a degree of data redundancy and an integer between 1 and n−1 inclusive; and providing a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and redundancy data stored in n−m remaining storage devices using the data recovery functions.

Another aspect of the present invention is an apparatus useful for generating redundancy data, including a storage medium or a logic circuit; and code embedded in the storage medium or the logic circuit, the code being represented by an n*H by n*Q encoding bit matrix which is representable by an n by n array of H by Q submatrices, n, H and Q being positive integers and H/Q<(n−m)/m, m being an integer between 1 and n−1 inclusive, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

Another aspect of the present invention is a method for generating redundant data from user data, including generating an n*H by n*Q encoding bit matrix, n, H and Q being positive integers and H/Q<(n−m)/m, m being an integer between 1 and n−1 inclusive; and generating redundant data by multiplying user data by the encoding bit matrix, wherein the step of generating the encoding bit matrix includes (a) generating an n*H by n*Q candidate matrix represented by an n by n array of H by Q submatrices; (b) selecting a set of m columns of the n by n array; (c) forming an m*H by (n−m)*Q composite submatrix of the candidate matrix from the H by Q submatrices located at the intersection of the set of m columns of the n by n array and (n−m) rows of the n by n array that correspond to the (n−m) columns not included in the set of m columns; (d) determining whether the composite submatrix is of maximal rank; (e) if the composite submatrix is not of maximal rank in step (d), repeating steps (a) to (d) for another candidate matrix; (f) if the composite submatrix is of maximal rank in step (d), repeat steps (b) to (d) for another set of m columns until all possible sets of m columns are selected; and (g) if all possible composite submatrices for a candidate matrix are of maximal rank, select the candidate matrix as the encoding bit matrix.

Another aspect of the present invention is in a system for providing data to and retrieving data from a plurality of n data channels, the data provided to each data channel comprising user data provided to H data portions and redundancy data provided to Q data redundancy portions, m being a value indicative of a degree of data redundancy and an integer from 1 to n−1 inclusive, the redundancy data having been generated from the user data using a data redundancy function capable of recovering from the loss of any m or fewer known channels, a method of detecting faulty data channels including retrieving user data and redundancy data from each data channel; generating expected redundancy data from the retrieved user data using the data redundancy function; and estimating which data channels are faulty by comparing the expected redundancy data with the retrieved redundancy data.

Other aspects of the invention include computer program products related to the above methods.

BRIEF DESCRIPTION OF THE DRAWINGS

FIG. 9 shows an exemplary redundancy data generation matrix and functions for m=2, n=5, H=1 and Q=1.

FIG. 16.1 is a schematic block diagram of an adjustable redundancy and recovery apparatus.

FIG. 16.2 is a flowchart describing a method of providing data redundancy adjustments.

FIG. 17.1 is a flowchart describing a method of storing data on the disk array.

FIG. 17.2 is a flowchart describing a method of generating redundancy data.

FIG. 18.1 is a flowchart describing a method of providing data from the disk array.

FIG. 18.2 is a flowchart describing a method of recovering data.

FIG. 23 is a timing/data diagram of the communication system of FIGS. 19 and 20.

FIG. 24.2 is a flowchart describing a method of communicating data in the communication system of FIGS. 19 and 20.

FIG. 34 is an example of defining subarrays and composite submatrices from a bit matrix where m=2 and n=5.

DETAILED DESCRIPTION OF THE PREFERRED EMBODIMENTS

Figure 1:
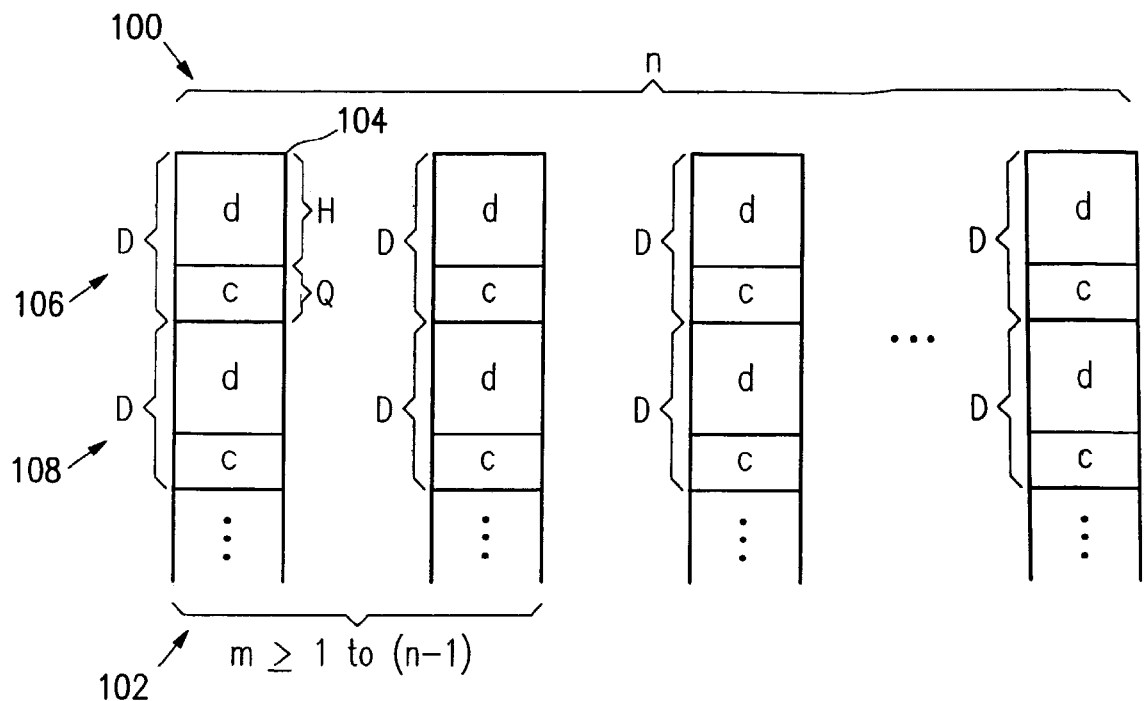
FIG. 1 is an illustration of a disk array configured in accordance with principles of the invention, where n is the number of disks and m is the number of failures allowed.

Extensive research and development has resulted in software algorithms that may be used to augment RAID storage technology by performing automatic, transparent recovery from multiple drive failures without interrupting ongoing operations. The inventive techniques extend RAID functionality in ways that allow for instantaneous data recovery in the event of multiple simultaneous or near simultaneous disk failures in a disk array.

In accordance with one inventive aspect, a data storage apparatus has a plurality of n disks and data comprising a plurality of n data groupings stored in the plurality of n disks respectively. Each one of the n data groupings comprises a data portion and a data redundancy portion. Advantageously, the n data portions are constructible from any and all combinations of (n−m) data grouping(s) from (n−m) disk(s) when the other m data grouping(s) are unavailable, where $1 \leq m < n$.

Thus, in an n-drive system, continued operations are possible even in the event of any combination of up to m drive failures (where $1 \leq m < n$). This adds a ground-breaking element to "extreme uptime" disk array technology, one that may find a natural home in many 24×7 operational environments. Moreover, because these algorithms have exceptionally fast computational speeds, storage transfer rate performance actually increases while adding virtually unlimited data protection. Compared to conventional RAID storage, the inventive storage system improves storage reliability while enhancing overall system performance. The functions are simple and may be easily stored in gate level logic or logic arrays. Preferably, minimal and "sparse" encoding functions are selected to minimize the amount of logic needed to encode the redundancy information. The algorithms may also allow for users to select the degree of "disk-loss insurance" desired.

As an example, an 18-disk array can be "coded" to allow three disks to be missing (n=18, m=3). With an "18/3" configuration, a total of somewhat less than fifteen disks worth of information would be stored, on the 18-disk array. In an example code (described in Appendix A) it is 14.4 disks worth. 1/18th of the original data is placed on each of the eighteen disks, and an additional twenty-five percent of coding information is included on each disk. Any three of the eighteen disks may fail and the full data can be reconstructed, in the same way that a single disk of an 18-disk RAID-5 array can fail and the data can be reconstructed.

As described herein, many inventive aspects relate to providing useful and practical applications for a new family of codes, herein referred to as "near-Wiencko codes" ("Wiencko" is pronounced "WEN-SCO"). The codes may be applied in connection with simple exclusive-OR (XOR) logic. In data storage applications, this is a family of codes where n is the total number of disks in the array, and m is the number of disks that are allowed to be missing while still being able to fully recover the data. When n−m disks survive, the original data can be fully recovered. The efficiency is nearly ideal, because the original quantity of "clear data" would occupy almost n−m disks. The inventive techniques may extend RAID functionality, while still retaining the advantages of traditional RAID techniques.

Another family of codes useful for data redundancy calculation and data recovery, referred to as "Wiencko codes", is described in U.S. Pat. No. 6,557,123, of which the present application is a continuation-in-part.

In a more particularly described application, a disk array has n disks with a stripe set stored across the n disks. Each stripe of the stripe set has a data portion of H data bits and a redundancy portion of Q redundancy bits. A relationship exists between the data portions and the redundancy portions based on an n*H by n*Q bit matrix. The bit matrix is representible by an n by n array of H by Q bit submatrices, where $n/m > (H/Q)+1$. The bit matrix also has a plurality of $n!/(m!*(n-m)!)$ composite bit submatrices definable therefrom. Each such composite bit submatrix is more particularly definable from bit submatrices at the intersection of a unique selection of m column(s) of the n by n array and a unique selection of (n−m) row(s) of the n by n array that correspond to those (n−m) column(s) not included in the unique selection of m column(s). Each one of these composite submatrices is of maximal rank. This maximal rank is, by well-known mathematical principles, equal to H*m. The relationship between the data portions and the redundancy portions is such that each one of Q redundancy bits is the exclusive-OR of the n*H bits of the data portions and the n*H bits in the row of the bit matrix associated with such redundancy bit.

Data Storage. FIG. 1 is an illustration of a plurality of n devices 100, of which up to m devices 102 may be unavailable and the user data is still recoverable. A number of stripe sets are spread across the n devices 100, such as a plurality of n stripe sets 106 and a plurality of n stripe sets 108. Each one of n devices 100 has a stripe which includes user data (indicated as "d") and redundancy data (indicated as "c"). The user data is in "clear" form and the redundancy data is generated based on near-Wiencko redundancy generation functions.

Figure 4:
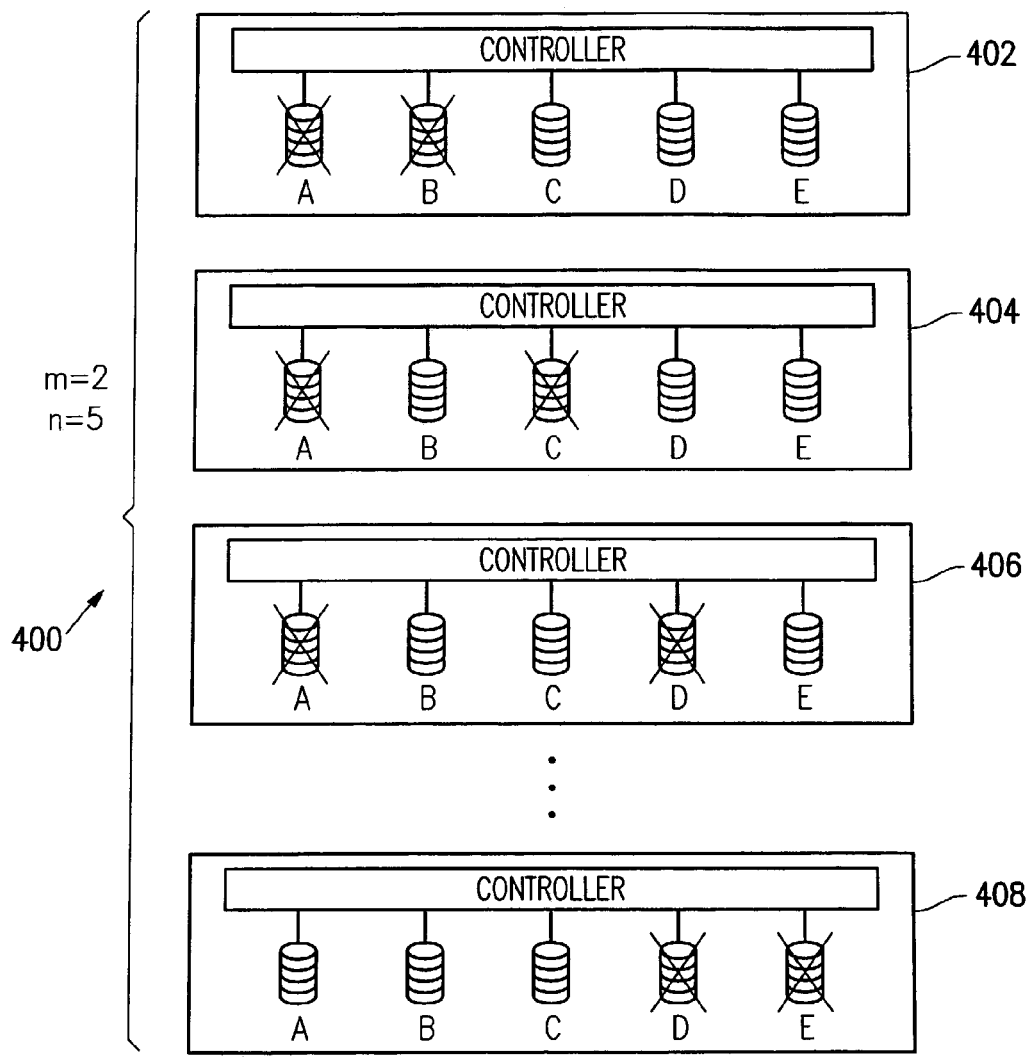
FIG. 4 is an illustration of multiple failure conditions of a storage system from which data is recoverable.

Referring now to FIG. 4, an illustration shows a number of different failure conditions 400 that a storage system can tolerate using one exemplary configuration of the present invention. The storage system has five disk drives (A through E), where any and all possible combinations of up to two drives may fail and the data is still recoverable. An "X" over a disk drive indicates a failure for that drive. A failure condition 402 shows that disk drives A and B have both failed; a failure condition 404 shows that disk drives A and C have both failed; a failure condition 406 shows that disk drives A and D have both failed; and so on for a failure condition 408 where disk drives D and E have both failed. For all of these failure conditions, the data is still recoverable from the storage system. These failure conditions are more fully summarized in a table 410 in FIG. 4.

Figure 5:
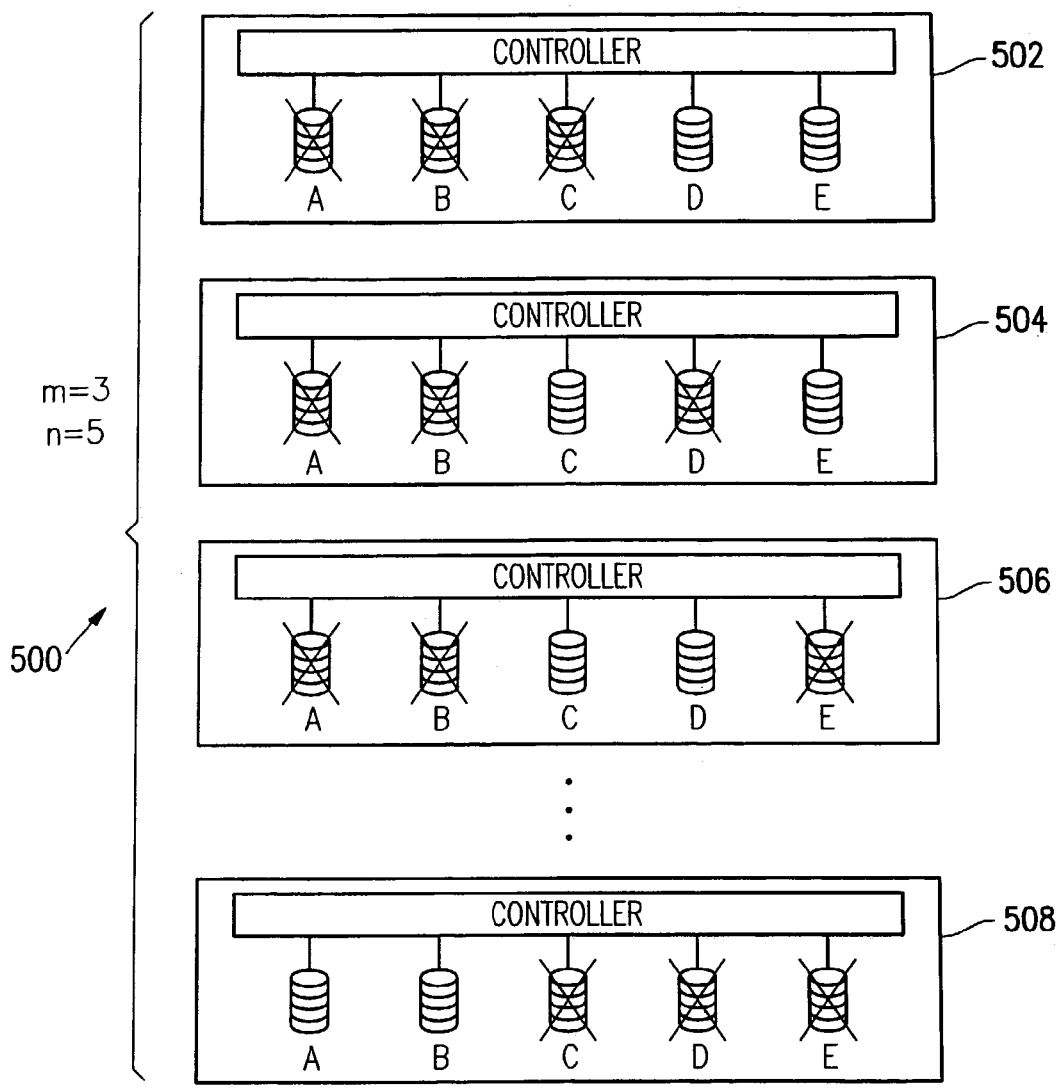
FIG. 5 is an illustration of multiple failure conditions of a storage system from which data is recoverable.

FIG. 5 is a diagram illustrating a number of different failure conditions 500 that an inventive storage system can tolerate using another exemplary configuration of the present invention. Here, the storage system has five disk drives (A through E) where any and all possible combinations of up to three drives may fail and the data is still recoverable. A failure condition 502 shows that disk drives A, B, and C have failed; a failure condition 504 shows that disk drives A, B, and D have failed; a failure condition 506 shows that disk drives A, B, and E have failed; and so on for a failure condition 508 where disk drives C, D, and E have failed. For all of these failure conditions, the data is still recoverable from the storage system. These failure conditions are more fully summarized in a table 510 in FIG. 5.

As apparent, the redundancy configuration of FIG. 5 provides more data redundancy than that of FIG. 4. The tradeoff should be apparent: a storage system with more data redundancy (FIG. 5) is less likely to have a nonrecoverable failure but will have less space to store user data. Users of a storage system may want some flexibility to adjust this data redundancy. As will be described in more detail below, the inventive storage system may allow for adjustment of "disk loss insurance" in response to user input (e.g., administrative control data). The failure conditions shown in FIGS. 4 and 5, for example, could be failure conditions from the same storage system in two different programmed configurations. In one embodiment, the variable m can be made adjustable from 1 to (n−1).

Data Storage and Near-Wiencko Codes. Definitions are provided for discussion. These definitions should not be used in a limiting sense when construing terms, but are provided in order to teach those skilled in the art how to practice aspects of the invention in connection with the examples provided.

A "near-Wiencko system" is a collection of similar stripe sets occupying a set of n parallel devices, having the capabilities of data storage, parity formation, and reconstruction as described below. A "device" may be a physical disk, a partition of a physical disk, a file on a physical disk, or other data storage hardware or software or parallel data communications hardware or software of any sort. A "disk" in the context of this description is the same as device. A "physical disk" may be a hard drive, floppy drive, or other randomly-accessed digital block storage device, or hardware or digital programming of equivalent functionality.

A "stripe" is that part of a stripe set that resides on a single disk. Every stripe of a stripe set is an integer number of chunks, and starts and ends at chunk boundaries. A certain number of chunks of the stripe consist of data, and the rest consist of parity. A "stripe set" is a minimal set of chunks, distributed over all n disks in a near-Wiencko system, that form a self-contained whole from the point of view of data storage, parity formation, and reconstruction algorithms. The capabilities of a near-Wiencko system are fully realized over a stripe set. Stripe sets need not influence one another's parity or reconstructed data.

A "block" is the minimum contiguous collection of data that can be read from or written to a device. In the case of a physical disk, a block is often some multiple of 512 bytes (4096 bits); other communication devices may have usable block sizes as small as one bit. A "chunk" is the maximum contiguous collection of data that is treated as an indivisible unit by the near-Wiencko code. Every bit of a chunk is treated identically, in data and parity operations relating to bits in other chunks at the same relative bit position. A chunk is an integer number of blocks, and starts and ends at block boundaries. A "code stripe" refers to those chunks of a stripe that consist of parity. A "data stripe" refers to those chunks of a stripe that consist of data.

A near-Wiencko code n.m, where n>m>0 are integers, may be utilized for storing binary data on n similar devices, in such a way that any m of the devices can be removed or destroyed and all of the data are still recoverable. (Here, "similar" means their raw data storage capability is the same when all organized by one chunk size, but the devices themselves may be physically dissimilar.)

A near-Wiencko code may be associated with the following terms and relationships. Data is organized in chunks of a certain number of bits each. D chunks form a stripe (wholly on one of the n disks) and n stripes, one on each disk, form a stripe set. H and Q are certain positive numbers satisfying $H*m<Q*(n-m)$, and $D=H+Q$. The integer parameter p is defined to be $p=gcd(H,Q)$, and $D1=D/p$ is therefore an integer. Chunk size and stripe size are constant throughout the near-Wiencko system (at least at one given time), and each disk of the near-Wiencko system contains the same number of stripes, all organized into stripe sets. Every stripe consists of H data chunks and Q parity chunks. There is a one-to-one relationship between the raw decoded data stored on the near-Wiencko system and the data found in the data chunks of all the stripes of all the stripe sets in the near-Wiencko system.

It follows that the raw data capacity of the near-Wiencko system equals $H*n/D$, which is less than and can be close to the theoretically maximum value of n−m, where data capacity is measured in units of one raw disk capacity. It also follows that for a system in which timing is dominated by data transmission, timing to and from disks, and data transmission in parallel to or from any set of disks overlaps with no significant time penalty, and for a near-Wiencko system that is close to the above theoretically maximum value of raw data capacity, the near-Wiencko system approaches the theoretical maximum raw throughput of n for large reads and n−m for "large" writes, where throughput is measured in units of one raw disk throughput and "large" means spanning many stripe sets.

The data in the parity chunks of a stripe set is determined from the data in the data chunks of that stripe set, using a bitwise XOR matrix. Here, "bitwise" means that the k-th bit of any parity chunk is independent of all but the k-th bit of each data chunk in that stripe set (where k is any natural number less than or equal to the chunk size in bits), and the formula for calculating this bit is the same for every k in every stripe set of this near-Wiencko system. "XOR matrix" means that the formula includes defining a given parity bit by specifying a subset of its available data bits and XORing all the data in those places. Thus, there are n*Q parity formulas, and each parity formula consists of specifying a subset of n*H data bits, one in the k-th position in each chunk.

In addition to being a bitwise XOR matrix, a near-Wiencko code should be solvable for any combination of m lost disks. A bitwise XOR parity matrix is defined to be solvable for a combination of m disks if the m*H data chunks of a stripe set on those m disks can be determined from the (n−m)*Q parity chunks and (n−m)*H data chunks of that stripe set on the remaining n−m disks. For a given n/m, a near-Wiencko code solution is not necessarily unique for that n/m. For each case, there is a smallest positive integer p for which a near-Wiencko code exists with parameter p as defined above. A smaller value of p greatly improves the computational efficiency of the algorithm. However, a larger value of p, or of D, may allow the code to more closely approach the theoretically maximum value of raw data capacity. Those skilled in the art can use this tradeoff to optimize a code for specific user requirements.

A subset of the near-Wiencko codes, which have advantages in calculation, proving, key storage, and encoding and decoding efficiency, are rotationally symmetric near-Wiencko codes. These satisfy the following additional condition: if each disk is given a unique index between 0 and n−1, then the parity formula for a given parity (defined by its parity index between 0 and Q−1, and its disk index) specifies its subset from the data chunks (each defined by its data index between 0 and H−1, and its disk index) using only the difference modulo n between the parity disk index and any data disk index, not the absolute data disk index. Thus for a given parity index, the parity formulas are the same for all the disk indices, except for a rotation modulo n of disk indices.

Further details regarding near-Wiencko codes are now described. In the following discussion, a "bit" shall mean a zero or one, considered as operating under the addition and multiplication rules of the field of order 2. The common name for such addition is "XOR" and for such multiplication is "AND". A "bit vector" shall be a vector whose scalar entries are bits, and a "bit matrix" shall be a matrix whose scalar entries are bits. Operations on bit vectors and bit matrices are analogous to standard vector and matrix operations, following the rules of linear algebra over the field of order 2.

Let H and Q be positive integers, and j and k be positive integers. A "j by k array of H by Q matrices" is a set of j*k matrices, each of dimension H by Q. arranged in double subscript order with the j subscript running fastest (horizontally), where the component matrices themselves have the H subscript running fastest.

This may be visualized as a matrix whose entries are themselves matrices:

| $M_{00}$ | $M_{10}$ | ... | $M_{J0}$ |
| $M_{01}$ | $M_{11}$ | ... | $M_{J1}$ |
| $M_{0K}$ | $M_{1K}$ | ... | $M_{JK}$ | where J=j−1, and K=k−1. Each M is itself an H by Q matrix.

An "equivalent matrix to an array of matrices" (with dimensions as given above) is the j*H by k*Q matrix that follows by resolving each matrix entry above into its array of scalar entries. Thus, the x+z*H, y+w*Q entry of the equivalent matrix is the x, y entry of $M_{zw}$ in the above array of matrices, where 0<=x<H, 0<=y<Q, 0<=z<j, 0<=w<k.

Let n>m>0 be integers. A "near-Wiencko array of matrices of type (n, m)" is an n by n array of H by Q bit matrices, where H and Q are positive integers such that $$n/m > (H+Q)/Q = H/Q+1,$$

and the array satisfies the following property: for every set S of m integers between 0 and n−1, the subarray, created from the array by keeping those array matrices whose row index w is not in S and whose column index z is in S, has an equivalent matrix of maximal rank. Here, "of maximal rank" has the usual matrix theoretic meaning as applied to matrices over the field of order two. A term for this is "parity solvable" and the matrix is a "parity matrix." Note that the process described above creates an m by (n−n) array of H by Q matrices, and by the relationship above, its equivalent matrix is a rectangular matrix with horizontal dimension H*m which is less than its vertical dimension Q*(n−m).

Because the horizontal dimension is less than the vertical dimension, the matrix transforms bit vectors of dimension H*m to longer bit vectors of dimension Q*(n−m) by the standard mathematical operation of bit matrix multiplication. It is a well-known mathematical fact that if and only if the above mentioned equivalent matrix is of maximal rank, which is rank H*m, then a non-unique matrix of vertical dimension H*m and horizontal dimension Q*(n−m) exists which, by bit matrix multiplication, will return any of the longer bit vectors thus produced to the bit vector of dimension H*m from which it was produced. Any such matrix will be called a "solution matrix."

A "near-Wiencko matrix" is an equivalent matrix to a near-Wiencko array of matrices. A "zero diagonal near-Wiencko array of matrices" is a near-Wiencko array of matrices that satisfies the additional condition: $M_{zw}=0$ for each matrix such that z=w (that is, each diagonal entry). A "rotationally symmetric near-Wiencko array of matrices" is a near-Wiencko array of matrices satisfying the following additional condition: $M_{zw}=M_{uv}$ whenever z−w=u−v modulo n. A "zero diagonal, rotationally symmetric near-Wiencko array standard description" is the subarray of a zero diagonal, rotationally symmetric near-Wiencko array of matrices created by keeping those entries for which w>0 and z=0. The above conditions make it easy to generate the entire near-Wiencko array from its standard description. Zero diagonal, and rotational symmetry, and sparseness or near-fullness, are among the conditions on near-Wiencko matrices that provide more efficient implementations of the algorithm, but are not necessary for functionality.

Figure 33:
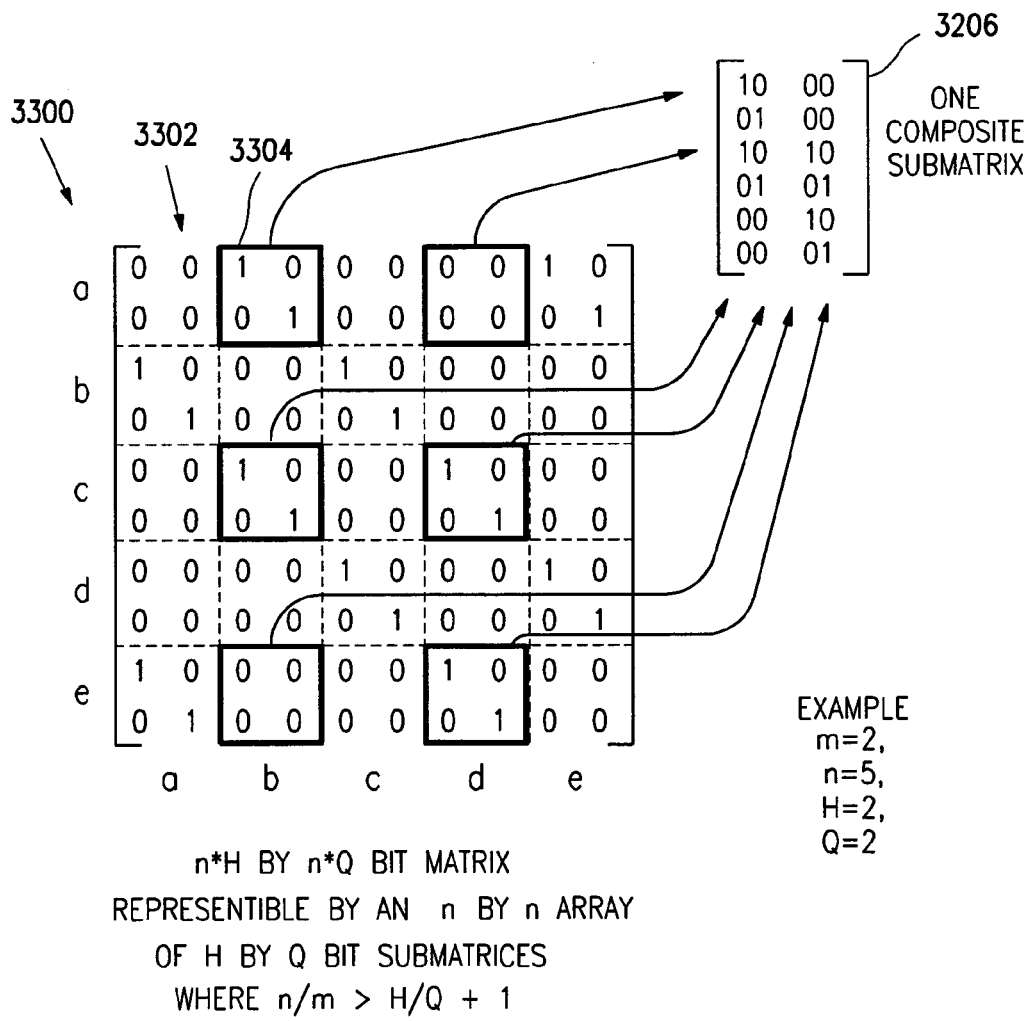
FIG. 33 is an example of a near-Wiencko bit matrix.

The following description relates to an example of a near-Wiencko array. A near-Wiencko array of type (5,2) with H=2 and Q=2 is shown in FIG. 33. Inspection shows that it is zero diagonal and rotationally symmetric; therefore it can be represented by the standard description

10—
01
00—
00
00—
00
10—
01 where the dashes show the bounds of the array entries. It now remains to be proven that it satisfies the "maximal rank" conditions. Because of the rotational symmetry, the ten possible combinations (n!/(m!*(n−m)!)=5!/2!*(5−2)!=10) found in the subset S of two numbers between 0 and 4 reduce to only two essentially different ones: S=(0, 1) and S=(0, 2)

The S=(0,1) case reduces to those submatrices in the intersection of columns "a" and "c" and rows "b", "d", and "e":

```
0010
0001                    000010
0000    Solvable =>     000001
0000                    100000
1000                    010000
0100
```

The S=(0, 2) case reduces to those submatrices in the intersection of columns "a" and "c" and rows "b", "d", and "e":

```
1010
0101                    000010
0010    Solvable =>     000001
0001                    001000
1000                    000100
0100
```

Since both of these are of maximal rank, so are the other eight (due to the rotational symmetry). Therefore, the bit matrix in FIG. 33 is a near-Wiencko array. It is, in fact, a p=2 equivalent code to the H=1,Q=1 code of FIG. 9, but with the matrix dimension doubled to illustrate the handling of an array of matrices. It is important to notice that each solution matrix given is not unique; there are other solution matrices which would function equally well.

Figure 32:
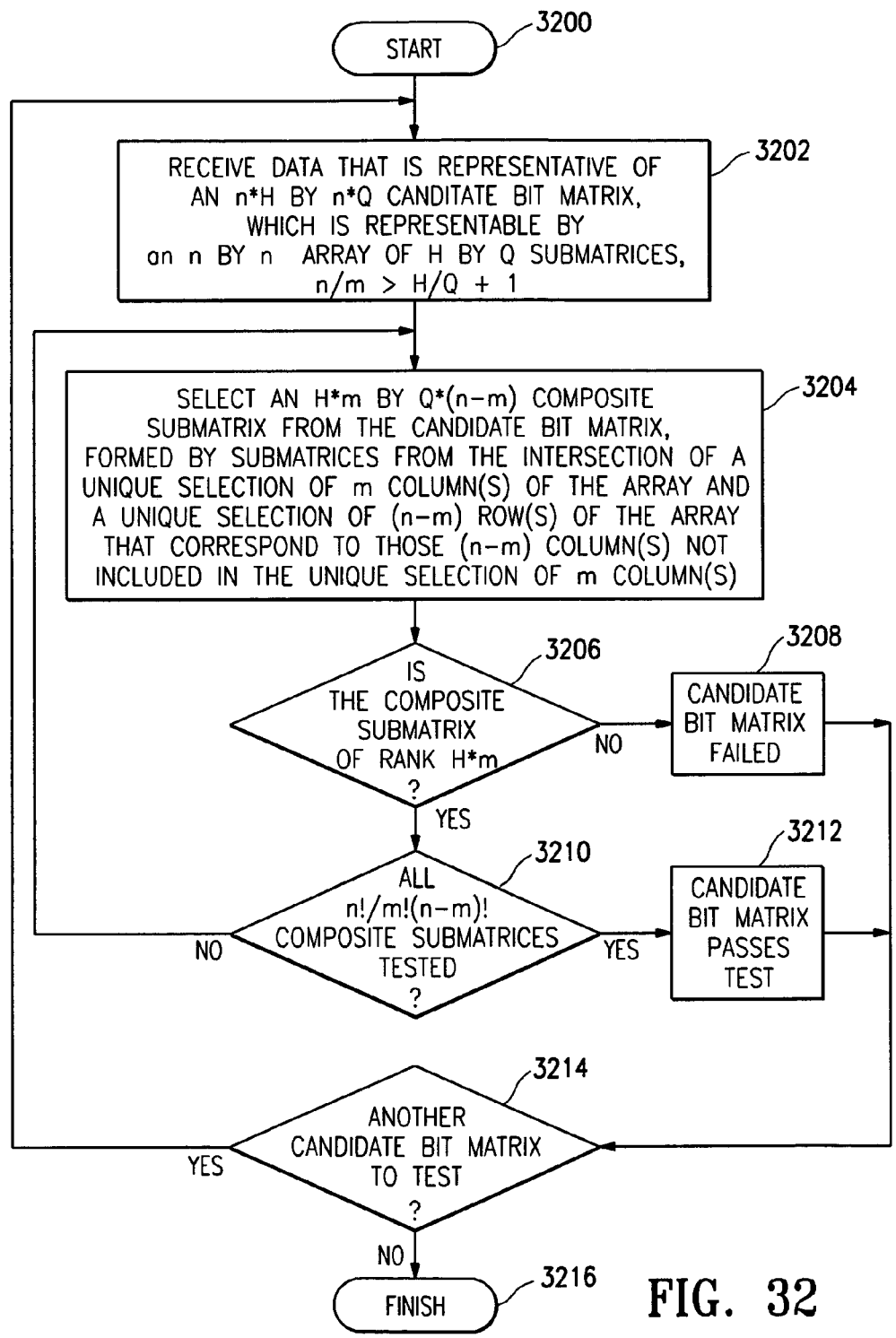
FIG. 32 is a flowchart describing a method of determining and/or verifying whether a candidate bit matrix is a near-Wiencko bit matrix.

Referring now to FIG. 32, a flowchart is shown which describes a method for determining and/or validating that a given bit matrix is a near-Wiencko bit matrix. This method may be embodied in the form of software executable by a processor. Beginning at a start block 3200, data that is representative of candidate bit matrix is received (step 3202). This data represents one possible near-Wiencko solution for a given m and n. More particularly, the candidate data is representative of an n*H by n*Q candidate bit matrix, which is representible by an n by n array of H by Q bit submatrices, where n/m>(H/Q)+1. In this method, it may be tested that the n/m>(H/Q)+1 condition is satisfied.

Referring to FIG. 33, an example of such a candidate bit matrix 3300 is shown for an m=2, n=5, H=2, and Q=2 case. As illustrated, candidate bit matrix 3300 is representible by a 5-by-5 array of 2-by-2 bit submatrices 3302, such as a submatrix 3304.

Figure 35:
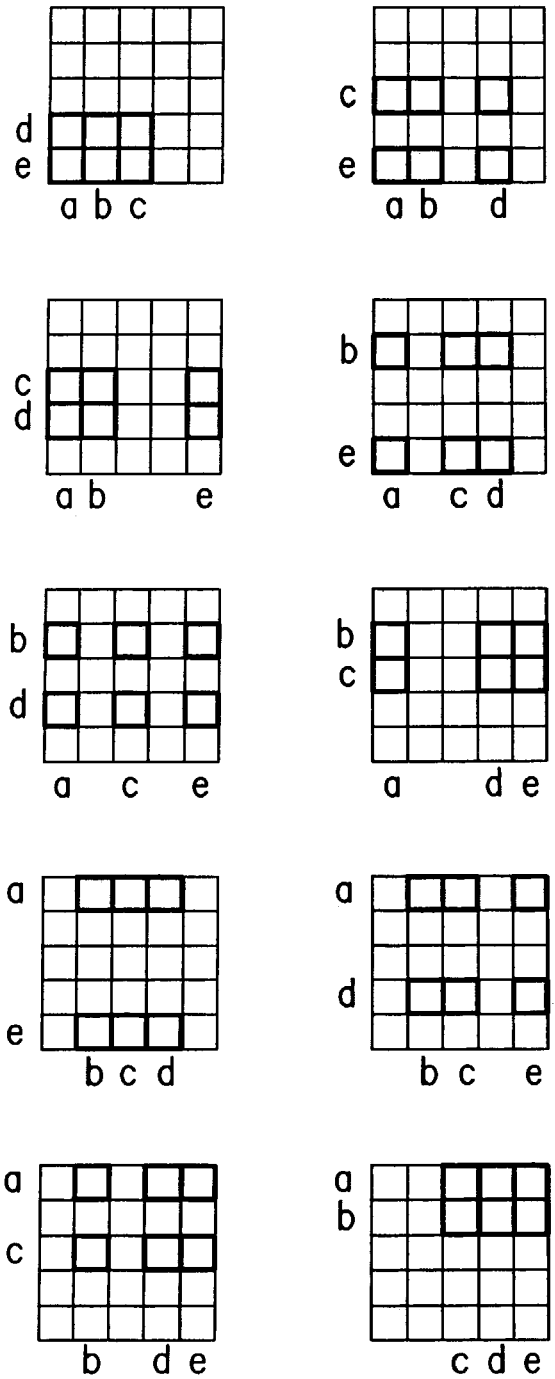
FIG. 35 is an example of defining subarrays and composite submatrices from a bit matrix where m=3 and n=5.
Figure 36:
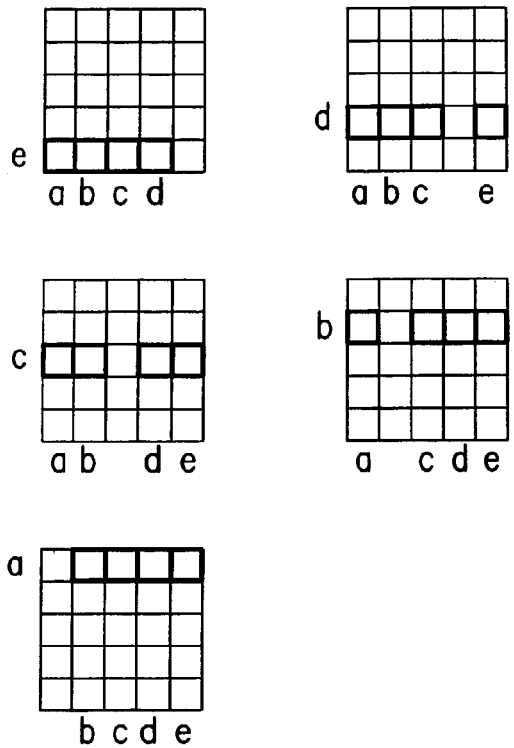
FIG. 36 is an example of defining subarrays and composite submatrices from a bit matrix where m=4 and n=5.

Back to FIG. 32, an H*m by Q*(n−m) composite submatrix is selected from the candidate bit matrix (step 3204). The composite submatrix is formed by submatrices from the intersection of a unique selection of m column(s) of the array and a unique selection of (n−m) row(s) of the array that correspond to those column(s) not included in the unique selection of m column(s). There are n!/(m!*(n−m)!) such composite submatrices that may be formed from the candidate bit matrix. Referring back to FIG. 33, an example of such a composite submatrix 3206 is shown for the m=2, n=5, H=2, and Q=2 case. As illustrated, composite submatrix 3206 is formed by submatrices 3302 taken from the intersection of a unique selection of m (two) columns of the array (columns B and D) and a unique selection of n−m (three) rows of the array that correspond to those n−m (three) columns not included in the unique selection of m (two) columns (columns A, C, and E). FIGS. 34, 35, and 36 show further examples of forming such subarrays and composite submatrices. More particularly, FIG. 34 shows all such composite submatrices for m=2 and n=5; FIG. 35 shows all such composite submatrices for m=3 and n=5; and FIG. 36 shows all such composite submatrices formed for m=4 and n=5.

Back to the flowchart of FIG. 32, the composite submatrix is tested for its rank (step 3206). If the composite submatrix is of maximal rank (rank H*m) at step 3206, it is determined whether all n!/(m!*(n−m)!) composite submatrices associated with the candidate bit matrix have been tested (step 3210). If all such composite submatrices have been tested and are of maximal rank, the overall test is satisfied and the candidate bit matrix is a valid solution (step 3212). If the composite submatrix is not of maximal rank at step 3206, the test fails and the candidate bit matrix is not a solution (step 3208). If any other candidate bit matrices are to be tested (step 3214), the flowchart repeats at step 3202 (the test may have failed at step 3208, or multiple solutions may be desired after completion of step 3212). If no other candidate bit matrices are to be tested at step 3214, the flowchart ends at a finish block 3216.

The above relationships describe near-Wiencko codes that are "ideal" and preferred codes. It is understood, however, that variations on near-Wiencko codes may be utilized. For example, codes may be provided such that for every value of $\mu$, $0<\mu<=m$, a subset of all possible combinations of $\mu$ unavailable disks is recoverable. Any available codes that provide recovery for a limited subset of all combinations of m failures (perhaps a majority) may be utilized.

Figure 8:
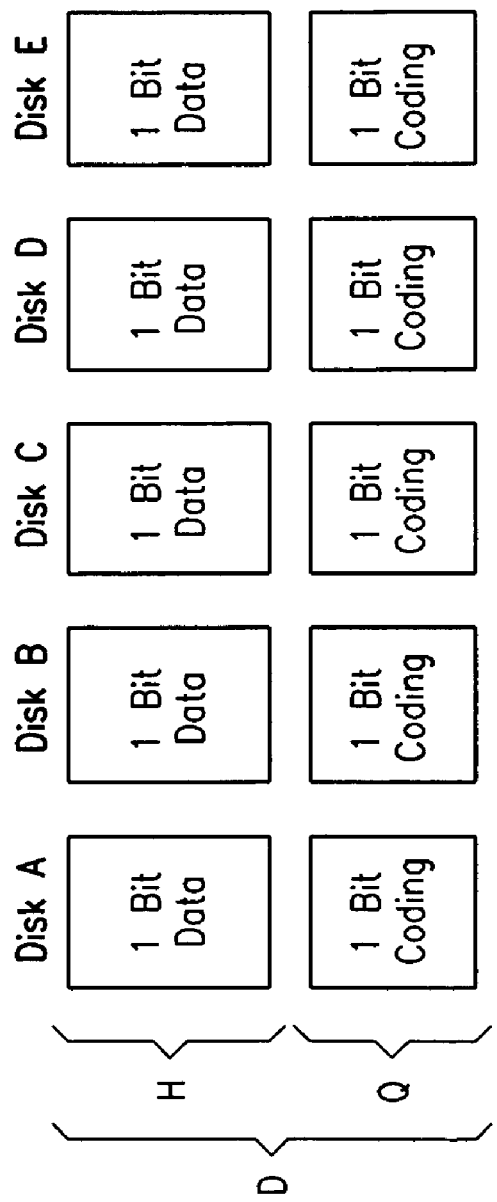
FIG. 8 is an example of a disk array where m (the number of disks) is five and n (the maximum number of failures allowed) is two, and when H=1 and Q=1.

Reference is now made to FIG. 8. Some of the relationships and examples described above may be repeated in the following description and examples for further clarity. The data and code layout for a disk array with a "5/2" configuration is shown in FIG. 8. Assume a chunk size is one bit. To begin the procedure, a set of operations must be performed on stripes of data. As described above, the number of bits in minimum stripe on a disk depends on a number of factors, including n, m, H, and Q where H*m<Q*(n−m). Another contributor is the greatest common factor p of the two numbers H and Q, which is represented by p=GCF(H, Q). The number of bits in a minimum data stripe is H, and the number of bits in a minimum code stripe is Q. For a "5/2" configuration, with five (5) total disks coded to allow two to be missing, a solution exists in which H=1, Q=1, and hence p=1 and the raw data capacity is 2.5 disks (0.5 disks short of the theoretical maximum of 3). On the other hand, the raw data stripe set size is only 5 chunks, as contrasted with the stripe set size greater than or equal to 15 that is required for a Wiencko code as described in U.S. Pat. No.

6,557,123 referenced above. This smaller stripe set size can give efficiency advantages offsetting the smaller raw data capacity. Another example, for a "5/3" configuration, has n=5, m=3, H=1, Q=2, hence p=1, raw data stripe set size =5 chunks (as opposed to 10 for a Wiencko code), raw data capacity =1 and ⅔ disks (⅓ disk short of the theoretical maximum of 2). These and other examples are detailed below and in Appendix A.

The user data bits may be stored in "clear" form, so when writing data, the only additional task is to calculate and store the code bits on each disk. Each bit of the code stripe of a given disk is an XOR of some of the data bits of the other disks. An encoding mask r can be defined, composed of mask elements $r_{nm}$ in which a mask element value of "1" means inclusion in the XOR calculation, and a value of "0" means exclusion from the XOR calculation.

Suppose n=5 and m=3. The encoding matrix for data bits A, B, C, D, and E to yield code bits A', A", B', B", C', C", D', D", E' and E" can be represented as follows, with "(+)" denoting "exclusive OR":

$$A' = r1,1\ A\ (+)\ r1,2\ B\ (+)\ r1,3\ C\ (+)\ r1,4\ D\ (+)\ r1,5\ E$$
$$A'' = s1,1\ A\ (+)\ s1,2\ B\ (+)\ s1,3\ C\ (+)\ s1,4\ D\ (+)\ s1,5\ E$$
$$B' = r2,1\ A\ (+)\ r2,2\ B\ (+)\ r2,3\ C\ (+)\ r2,4\ D\ (+)\ r2,5\ E$$
$$B'' = s2,1\ A\ (+)\ s2,2\ B\ (+)\ s2,3\ C\ (+)\ s2,4\ D\ (+)\ s2,5\ E$$
$$C' = r3,1\ A\ (+)\ r3,2\ B\ (+)\ r3,3\ C\ (+)\ r3,4\ D\ (+)\ r3,5\ E$$
$$C'' = s3,1\ A\ (+)\ s3,2\ B\ (+)\ s3,3\ C\ (+)\ s3,4\ D\ (+)\ s3,5\ E$$
$$D' = r4,1\ A\ (+)\ r4,2\ B\ (+)\ r4,3\ C\ (+)\ r4,4\ D\ (+)\ r4,5\ E$$
$$D'' = s4,1\ A\ (+)\ s4,2\ B\ (+)\ s4,3\ C\ (+)\ s4,4\ D\ (+)\ s4,5\ E$$
$$E' = r5,1\ A\ (+)\ r5,2\ B\ (+)\ r5,3\ C\ (+)\ r5,4\ D\ (+)\ r5,5\ E$$
$$E'' = s5,1\ A\ (+)\ s5,2\ B\ (+)\ s5,3\ C\ (+)\ s5,4\ D\ (+)\ s5,5\ E$$

Alternatively, this equation set may be represented simply by referring to the mask, $$rs = \{r1,1\ \ r1,2\ \ r1,3\ \ r1,4\ \ r1,5\}$$
$$\{s1,1\ \ s1,2\ \ s1,3\ \ s1,4\ \ s1,5\}$$
$$\{r2,1\ \ r2,2\ \ r2,3\ \ r2,4\ \ r2,5\}$$
$$\{s2,1\ \ s2,2\ \ s2,3\ \ s2,4\ \ s2,5\}$$
$$\{r3,1\ \ r3,2\ \ r3,3\ \ r3,4\ \ r3,5\}$$
$$\{s3,1\ \ s3,2\ \ s3,3\ \ s3,4\ \ s3,5\}$$
$$\{r4,1\ \ r4,2\ \ r4,3\ \ r4,4\ \ r4,5\}$$
$$\{s4,1\ \ s4,2\ \ s4,3\ \ s4,4\ \ s4,5\}$$
$$\{r5,1\ \ r5,2\ \ r5,3\ \ r5,4\ \ r5,5\}$$
$$\{s5,1\ \ s5,2\ \ s5,3\ \ s5,4\ \ s5,5\}$$

The mask should be chosen such that a valid decoding solution exists for each combination of channels that can be missing. $rs_{xx}$ can be chosen to be 0 in all cases with no loss of information.

Example—"5/3" Configuration. Suppose n=5 and m=3. Let A, B, C, D, and E denote data bits for each of five disks in an array, and A', A", B', B", C', C", D', D", E' and E" denote coding bits. The encoding functions may be defined as

| | | |
|---|---|---|
| $A' = C(+)E$ | equivalent to $rs =$ | $\{0\ 0\ 1\ 0\ 1\}$ |
| $A'' = D$ | | $\{0\ 0\ 0\ 1\ 0\}$ |
| $B' = A(+)D$ | | $\{1\ 0\ 0\ 1\ 0\}$ |
| $B'' = E$ | | $\{0\ 0\ 0\ 0\ 1\}$ |
| $C' = B(+)E$ | | $\{0\ 1\ 0\ 0\ 1\}$ |
| $C'' = A$ | | $\{1\ 0\ 0\ 0\ 0\}$ |
| $D' = A(+)C$ | | $\{1\ 0\ 1\ 0\ 0\}$ |
| $D'' = B$ | | $\{0\ 1\ 0\ 0\ 0\}$ |
| $E' = B(+)D$ | | $\{0\ 1\ 0\ 1\ 0\}$ |
| $E'' = C$ | | $\{0\ 0\ 1\ 0\ 0\}$ |

Decoding Functions:

| Missing | | | |
|---|---|---|---|
| Disks A & B & C | A = D' (+) E" | B = D" | C = E" |
| Disks A & B & D | A = C" | B = E (+) C' | D = E (+) C' (+) E' |
| Disks B & C & D | B = E' (+) A" | C = E" | D = A" |
| Disks B & C & E | B = D" | C = A (+) D' | E = A (+) D' (+) A' |
| Disks C & D & E | C = A' (+) B" | D = A" | E = B" |
| Disks C & D & A | C = E" | D = B (+) E' | A = B (+) E' (+) B' |
| Disks D & E & A | D = B' (+) C" | E = B" | A = C" |
| Disks D & E & B | D = A" | E = C (+) A' | B = C (+) A' (+) C' |
| Disks E & A & B | E = C' (+) D" | A = C" | B = D" |
| Disks E & A & C | E = B" | A = D (+) B' | C = D (+) B' (+) D' |

Just as with the encoding functions, the decoding functions can be specified by use of a binary mask. Note that this encoding matrix mask is a circularly-symmetric matrix. When the mask is chosen with this property, a number of advantages are realized. A circularly-symmetric matrix can be fully described by a small subset of the complete mask. If we know the matrix is circularly symmetric, the complete encoding mask above can be fully specified using:

{1}
{0}
{0}
{1}
{1}
{0}
{0}
{0}

Note that this submatrix is the entire first column, except for the first disk's elements. The first disk's elements of the first column will always be zero, because they represent the trivial relation of A' and A" to A; it is never necessary to encode a disk's own data bits into a disk's coding bits.

Most cases of disk failures can be represented as rotations of a smaller number of unique failure cases. Thus, for A & B & C missing, B & C & D missing, C & D & E missing, D & E & A missing, and E & A & B missing, all of these can be considered rotations of the case in which A & B & C are missing. Similarly, B & C & E missing, C & D & A missing, D & E & B missing, and E & A & C missing, can be considered rotations of the case in which A & B & D are missing. When decoding, the ten cases of three disks missing can be represented as rotations of two unique cases. If the decode logic has this rotational ability built in, it is necessary to consider and store only the decode masks of the two rotationally unique cases.

Example—"5/2" Configuration. See FIG. 8, where n=5 disks total, m=2 disks missing, H=1 data bit per disk and Q=1 coding bit per disk (5 data bits to the array). As shown, the disks are designated A through E. FIG. 9 is an encode function matrix for redundancy data generation. The data bit of disk A is designated A1. The coding bit is designated as A'. Data and coding from the other channels B, C, D, and E are represented similarly. The binary matrices are shown with asterisks for ones and spaces for zeroes. The submatrix corresponding to the case in which disks A & B are missing are circled in the 1$^{st}$ table of FIG. 10. This submatrix appears, below in the decoding solution for disks A & B missing.

The coding mask selection is done during the design process, and does not need to be repeated during operation. The encoding function can be hardcoded into an arrangement of logic gates, or stored as a binary array mask that is retrieved to control the function of a logic array or in low-level software in a disk array system. As the number of disks in an array increases beyond four or five, it quickly becomes far more advantageous to use the binary array mask storage method.

(1) Decoding Function for A&B Missing. The following discussion makes reference to FIG. 10 of the drawings. For a particular set of m devices missing, a decoding function exists such that the missing data is equal to a set of XOR operations on the surviving code and data. The decoding function is found from the solution of a set of simultaneous equations in modulo-2 number space using XOR operations.

Figures 10, 10A:
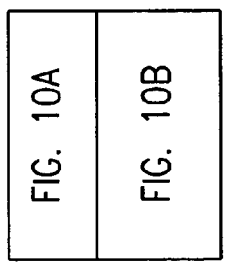
FIG. 10 shows an exemplary data recovery matrix and functions for m=2, n=5, H=1 and Q=1, for data on disks A and B being unavailable.

Mathematically, the decoding function is formed by taking a submatrix of the encoding function mask matrix, changing format to add columns for the coding bits, and then finding a modulo-2 solution matrix for the subset of the encoding function mask matrix. Identical operations are performed on the subset of the encoding mask matrix and the additional coding bit columns. A solution set is shown in FIG. 10. The modulo-2 matrix solutions for each unique non-rotational case of channels missing are performed during the design process in order to confirm proper mask selection. The results of these solutions constitute the decode functions, and can be stored as binary array masks, just like with the encoding function. Alternatively, since the decoding masks are easy to calculate from the encoding mask, it is an implementation option for the disk array system to calculate the decoding masks when needed (e.g., in software) from the stored encoding masks.

Figures 11, 11A:
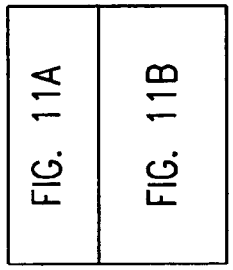
FIG. 11 shows an exemplary data recovery matrix and functions for m=2, n=5, H=1 and Q=1, for data on disks A and C being unavailable.
Figure 12A:
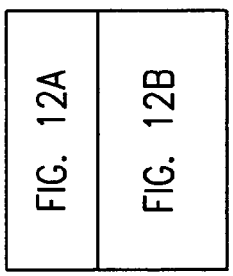
FIG. 12 shows an exemplary data recovery matrix and functions for m=2, n=5, H=1 and Q=1, for data on disks A and D being unavailable.

(2) For the decoding function for A&C missing, see FIG. 11. For convenience, the same encoding matrix is also reprinted. However, a different submatrix is highlighted (circled), to correspond with the case in which disks A&C are missing. A solution set is shown in FIG. 11. For the decoding function for A&D missing, see FIG. 12. For convenience, the same encoding matrix is also reprinted. However, a different submatrix is highlighted, to correspond with the case in which disks A&D are missing. A solution set is shown in FIG. 12.

Figures 13, 13A:
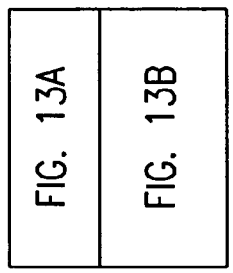
FIG. 13 shows an exemplary data recovery matrix and functions for m=2, n=5, H=1 and Q=1, for data on disks A and D being unavailable.

(3) A&D Missing is a Rotation of A&C Missing. See FIG. 13 of the drawings. Since the encoding matrix was designed to be circularly symmetric, the decoding function matrix mask for disk A & D missing is identical to a circular rotation of the case in which disks A & C are missing. This equivalence is demonstrated by starting to solve for disks A & D missing, and then circularly rotating this solution matrix to show that it is the same solution matrix as the case in which disks A & D are missing. To utilize the "A & C disks missing" solution for this case, recognize that disks A & D being missing is just a circular shift of variables by three positions from the case in which disks A & C are missing. Begin with the solution for disks A & C missing, and circularly rotate the variables three positions forward as follows:

A⇒D, B⇒E, C⇒A, D⇒B, E⇒C

Note that the cases of missing disks (AB, BC, CD, DE, EA) are all circular rotations of each other, and the cases of missing disks (AC, BD, CE, DA, EB) are all circular rotations of each other. Thus, there are ten total solution cases, but because of circular symmetry only two of them are computationally unique.

The encoding method is simple enough to allow, if desired, coding of different sets of data differently on the same array, depending on the importance of each data set. For example, data with low importance can be coded to allow one disk of an array to fail, data with moderate importance can be coded to allow two disks to fail, and data of high importance can be coded to allow three disks to fail. Alternatively, an entire disk array can have all of the data coded the same way.

Figure 6:
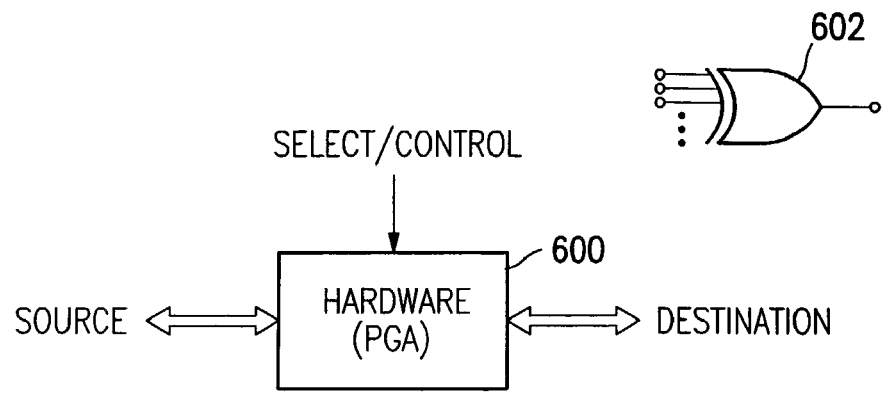
FIG. 6 is a diagram of hardware which may embody principles of the present invention.
Figure 7:
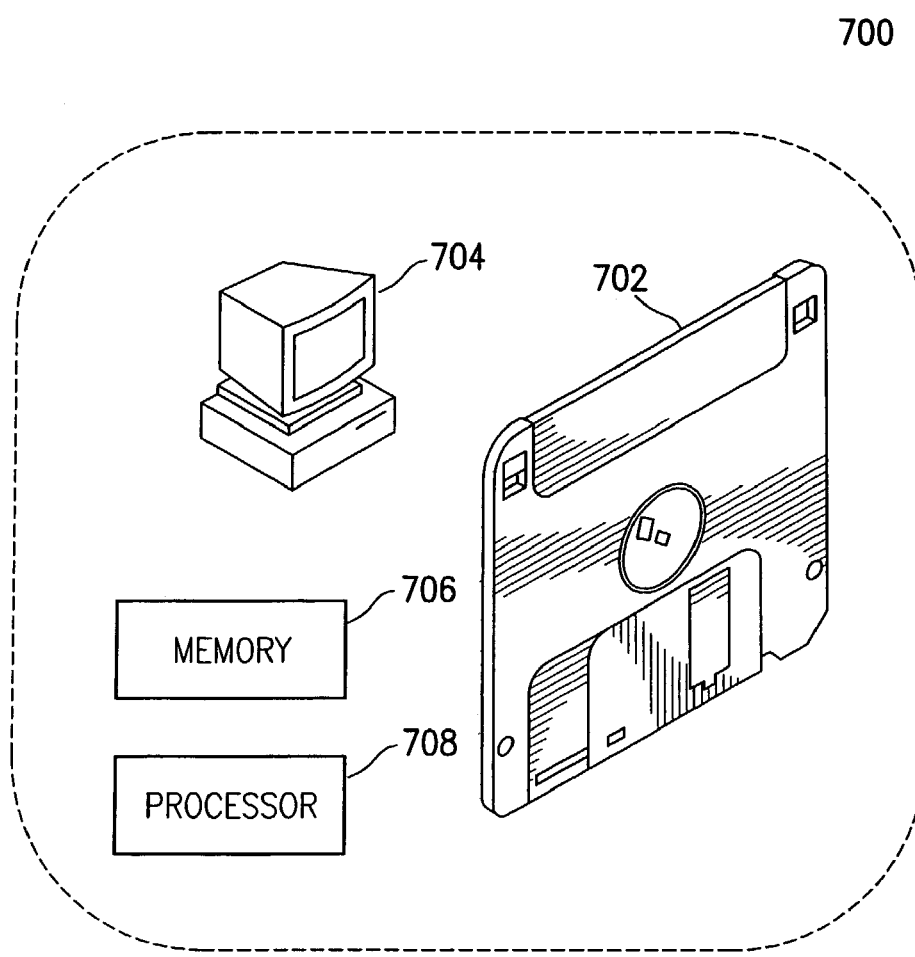
FIG. 7 is an illustration of various software components which may embody principles of the present invention.

Embodying and Applying Near-Wiencko Codes/Functions. Referring now to FIGS. 6 and 7, near-Wiencko codes/functions (as well as all related methods and apparatus described herein) can be embodied in a number of different ways. For example, the codes/functions described can be implemented in a hardware device 600, such as a programmable gate array (PGA), shown in FIG. 6. In this embodiment, simple exclusive-OR gates, such as an exclusive-OR gate 602, are easily combined in accordance with the desired functions. The codes/functions can also be embodied and implemented using software as indicated in FIG. 7. Such software is embedded or stored on a disk 702 or memory 706, and executable on a computer 704 or a processor 708. For providing redundancy adjustability (described in more detail later below), simple switches (hardware) or mask set selection (software) may be used. Here, the appropriate XOR logic circuits or mask sets are selected based on the control data.

Related Methods And Apparatus. FIGS. 16.2, 17.1, 17.2, 18.1, and 18.2 are flowcharts describing general methods which may be used in connection with the various embodiments. More particularly, FIG. 17.1 is a flowchart describing a method of generating redundancy data. Beginning at a start block 1700, user data is received for storage on a disk array (step 1702). Redundancy data is generated based on the user data and the set of data redundancy functions (step 1704). (If multiple sets of data redundancy functions are made available in the system, the set of data redundancy functions are those selected as described below in relation to FIG. 16.2.) The user data and the generated redundancy data are stored on the disk array (step 1706). The flowchart ends at a finish block 1708, but may repeat for other storage requests.

Step 1704 of FIG. 17.1 may be accomplished in connection with the method described in relation to the flowchart of FIG. 17.2. Beginning at a start block 1710, the data is multiplied modulo 2 by a near-Wiencko bit matrix (step 1712). More specifically, the stripe set data (n*H chunks) is expressed as a column vector to the right of the near-Wiencko matrix, and multiplied modulo 2 by the near-Wiencko matrix to get the stripe set parity (n*Q chunks). As apparent, this algorithm is very efficient (especially when the near-Wiencko matrix is sparse or nearly full). The flowchart of FIG. 17.2 ends at a finish block 1714.

FIG. 18.1 is a flowchart describing a method of recovering user data. Beginning at a start block 1800, a request for user data is received (step 1802). If all of the disks and data are available (step 1804), the user data is read from the disk array (step 1806). In this situation, data manipulation need not take place since the user data may be stored as "clear" data on the disks. The user data is then provided to the requester (step 1814). The flowchart ends at a finish block 1808, but may be repeated for each request. On the other hand, if some of the data is determined to be unavailable at step 1804, the appropriate data recovery functions associated with the available disks or data are selected (step 1810). The user data is then recovered using the selected data recovery functions, available user data and redundancy data (step 1812). The user data is provided to the user (step 1814), and the flowchart ends at finish block 1808.

Step 1810 of FIG. 18.1 may be accomplished using the method described in the flowchart of FIG. 18.2. Beginning at a start block 1816, the stripe set data found in the n−m remaining disks is arranged as in the encoding algorithm, with zeroes in place of the data found in the missing disks (step 1818). This arranged data is multiplied by that subarray of the near-Wiencko matrix that corresponds to array row numbers not found in S (rows corresponding to available disks) (step 1820). This step gives all the parity chunks for the stripes of the disks not found in S without the influence of the missing data. These parity chunks created are XOR'd with the parity actually found on the disks not found in S (step 1822); which by the linearity of matrix multiplication gives the non-S parity chunks that would have been produced by applying the near-Wiencko matrix to a data stripe set that included the missing data on the S disks but was zero on all the non-S disks. An appropriate solution matrix that exists for S is applied to this parity (step 1824), which yields the missing data. If reconstruction is to be carried out, parity for the disks in S can be created by matrix multiplication by the subarray of the near-Wiencko matrix that corresponds to row numbers in S.

The mathematical concepts involved in encoding and decoding are now described further by example. The simple example below involves a near-Wiencko array of type (5,2) with H=1 and Q=1:

| 0 | 1 | 0 | 0 | 1 |
|---|---|---|---|---|
| 1 | 0 | 1 | 0 | 0 |
| 0 | 1 | 0 | 1 | 0 | = W
| 0 | 0 | 1 | 0 | 1 |
| 1 | 0 | 0 | 1 | 0 |

The missing disks, for simplicity, will be 0 and 1. The S={0,1} case reduces to $$\begin{array}{c|cc|ccc} & \text{dead data} & & \text{live data} & & \\ \text{dead parity} & 0 & 1 & 0 & 0 & 1 \\ & 1 & 0 & 1 & 0 & 0 \\ \hline & 0 & 1 & 0 & 1 & 0 \\ \text{live parity} & 0 & 0 & 1 & 0 & 1 \\ & 1 & 0 & 0 & 1 & 0 \end{array} = \begin{array}{c|c} W'' & XS \\ \hline WS & W' \end{array} = W$$

where W" (dead to dead), XS (live to dead), WS (dead to live) and W' (live to live) are subarrays of the near-Wiencko array. (The same approach will work for deads that are not together, but is more complicated to visualize.)

If D is a data vector, then we similarly can write $$D = \begin{array}{c} D'' \\ \hline D' \end{array}$$

where D" is the part on the dead channels and D' on the live channels. Similarly for a parity vector $$P = \begin{array}{c} P'' \\ \hline P' \end{array}$$

Then by matrix multiplication the encoding procedure gives $$P = WD \qquad (1)$$

or $$\begin{array}{c} P'' \\ \hline P' \end{array} = \begin{array}{c|c} W''\#XS \\ \hline WS\#W' \end{array} \begin{array}{c} D'' \\ \hline D' \end{array} \qquad (2)$$

or $$P'' = (W''\,D'') + (XS\,D') \qquad (3a)$$

$$P' = (WS\,D'') + (W'\,D') \qquad (3b)$$

In the case we are working with (bit matrices), adding and subtracting are the same as "XOR" or "^", and multiplication is the same as "AND" or "&".

Now suppose D' and P' are known but D" and P" are lost, but we are assured that (1) holds true for the known matrix W. We now define $$P1=W'D'$$

and $$P3=P'$$

so P1 can be calculated and P3 read up from live data. Now set $$P2=P3-P1=P3\textasciicircum P1=P3+P1$$

We get from (3b) that $$WS\ D''=P2 \quad (4)$$

and because of the definition of a near-Wiencko Matrix, there exists a solution matrix JS with the property that $$JS\ WS=I$$

where I is the H*m dimensional identity matrix. It therefore follows that $$JS\ P2=JS(WS\ D'')=(JS\ WS)D''=D'' \quad (5)$$

which recovers the lost data. Another expression for (5) is $$D'' = JS(I\#W')\ \#\#\ \begin{matrix}P'\\D'\end{matrix} \quad (6)$$

where I is a live parity-sized identity matrix. This holds because $$(I\#W')\ \#\#\ \begin{matrix}P'\\D'\end{matrix} = (IP')+(W'D')=P'+P3=P1+P3=P1\textasciicircum P3$$

We define the preconditioning matrix $$PC=(I\#W')$$

We can then do (6) in two different ways:

$$D'' = (JS\ PC)\ \#\#\ \begin{matrix}P'\\D'\end{matrix} \quad \text{(single step)} \quad (6a)$$

$$D'' = JS\ (PC\ \#\#\ \begin{matrix}P'\\D'\end{matrix}) \quad \text{(two step)} \quad (6b)$$

The single step method, which precalculates (JS PC), is better for small n, the two step method is better for large n and sparse near-Wiencko matrices.

EXAMPLE

Matrix multiplication modulo 2 is used. # is not a number, but a separator between dead and live territory.

| W | D | P | |
|---|---|---|---|
| 01#001 | 1 | 1 | |
| 10#100 | 0 | 0 | P" |
| ##### | # = # | = | ### |
| 01#010 | 1 | 1 | P3 |
| 00#101 | 1 | 0 | |
| 10#010 | 1 | 0 | |

D" and P" are lost. D' and P3=P' mare known, as is W.

| W' | D' | | P1 |
|---|---|---|---|
| 010 | 1 | | 1 |
| 101 | 1 | = | 0 |
| 010 | 1 | | 1 |

| P1 | ^ | P3 | | P2 |
|---|---|---|---|---|
| 1 | | 1 | | 0 |
| 0 | | 0 | = | 0 |
| 1 | | 0 | | 1 |

| WS | | JS |
|---|---|---|
| 01 | | 001 |
| 00 | solution = | 100 |
| 10 | | |

| JS | P2 | | D" |
|---|---|---|---|
| 001 | 0 | | 1 |
| 100 | 0 | = | 0 |
| | 1 | | |

And thus, D" is recovered. P" can be recovered by encoding from D" and D'.

Detection of Burst Errors. The following discussion relates to a technique for error detection with use of a matrix parity coding technique. Coding matrices useful for error detection according to this technique include near-Wieneko matrices, Wiencko matrices as described in U.S. Pat. No. 6,557,123 referenced above, and any other suitable coding matrices, which are generally referred to simply as "coding matrix" or "coding matrices" in the following description. Coding matrices having mostly zero entries are preferred for practical reasons. This technique is especially applicable to burst errors. In some applications, it may be used as the primary error detection technique without use of any other error detection/correction codes. The methods now described may be similarly embodied in hardware or software as described herein.

The corresponding concepts for a coding matrix—a row or column whose constituent entries are H by Q matrices—are named a "channel row array" or "channel column array" to distinguish from these. In cases where the context is clear, either a channel row array or a channel column array may be called a "channel". A channel, in either case, is numbered from 0 to n−1. The "intersection of a row with a channel" is the intersection of a row with (the equivalent matrix of) a channel column array. It is always wholly contained in one entry matrix of the coding matrix, and always is a row of H bits. The "intersection of a column with a channel" is the intersection of a column with (the equivalent matrix of) a channel row array. It is always wholly contained in one entry matrix of the coding matrix, and always is a column of Q bits. Either of these is called "zero" if all its bits are zero, otherwise it is called "nonzero". A set of bits is called "related" if each bit comes from a different chunk of the same stripe set, and each bit is at the same bit offset from the start of its chunk. The maximum number of bits that can be related is n*(H+Q). A set of related bits is called a "related set", and a maximal set of related bits is a "full related set".

The error detection technique is as follows. At all times, both data and parity are received from all n channels. To detect faulty channels, the encoding procedure using the coding matrix is applied to the data and the results compared with the parity over a stripe set or a number of stripe sets, or over a portion of a stripe set whose bits have the same relative offsets in their respective chunks. All parity chunks which exhibit a discrepancy are noted.

Definition (error bit and delta bit): The "error bit" at position k in a parity chunk is the XOR of the value read at k of that parity chunk and the value calculated using the encoding procedure from the values at k of the corresponding data chunks. The "delta bit" of a certain bit location is the XOR of the correct value of the bit and the value read on a faulty channel.

Definition (zero favor): Let R be a random variable that takes the values 0 and 1, 0 with probability p and 1 with probability $q=1-p$. The "zero favor" of R is defined as $$z(R)=p-q \quad (1)$$

Lemma (zero favor of XOR): Let R1 and R2 be two independent random variables taking the values of 0 and 1. The zero favor of the XOR of R1 and R2 is the product of the zero favors of R1 and R2.

Proof: Let R be the XOR of R1 and R2. Using the obvious notation it follows from independence that $$p=p1p2+q1q2 \quad (2)$$

$$q=p1q2+q1p2 \quad (2)$$

so it follows that $$z(R)=p1(p2-q2)+q1(q2-p2)=(p1-q1)(p2-q2)=z(R1)z(R2) \quad (4)$$

which completes the proof

Theorem (Error Detection): (A) Suppose T is a set of faulty channels, so that T'=all channels not in T=a set of error-free channels. Any parity chunk on a channel of T' whose row in the coding matrix has a zero intersection with all channels of T will show no discrepancy when compared with the parity computed from the data in its stripe set. (B) Let the assumptions be as in (A) and, further, suppose that for a set of k full related sets, all delta data and parity bits from channels of T are independently random (a burst error) such that each bit has a zero favor of absolute value less than or equal to u<1.

Then the probability of a nonzero error bit at any of the parity locations in any of the k related sets is always greater than or equal to $$(1-u^{r+s})/2$$

where r is the number of ones in the intersection of its row of the coding matrix with all the channels of T, and s is 1 if the parity is in T and 0 if the parity is not in T.

Proof: (A) is a trivial consequence of the encoding scheme as described earlier above. (B) follows because the error bit is the XOR of r+s bits, each with a zero favor between u and −u. (Data or parity bits that are not in T do not contribute to the error bit, nor do data bits that meet a 0 in this parity bit's row of the coding matrix.) Applying the Lemma to the XOR of these r+s random variables gives $$-u^{r+s}<=z(\text{error bit})<=u^{r+s}$$

from which the claim follows. This completes the proof.

As a consequence of the theorem, it is extremely probable for a large burst size that all the parity chunks not included in (A) of the theorem will, in fact, exhibit errors. Thus, examining which parity chunks exhibit errors, in conjunction with the pattern of zeroes in the coding matrix, yields high probability information on which channels are good and which exhibit errors.

The error detection technique depends on the coding matrix. For each set T of faulty channels there is a unique maximal set R(T) of parity chunks that satisfy the hypotheses of (A) of the theorem. R(T) may be empty. Clearly if T is a subset of U then R(U) is a subset of R(T). Also if T is empty then R(T) is all the parity chunks, where if T is nonempty then R(T) is not all the parity chunks (it must exclude, for instance, the parities in channels of T). A parity row "hits" a channel if either that parity chunk is a part of that channel, or that row in the coding matrix has a nonzero intersection with that channel. R(T) is the set of parities that do not hit any member of T. A coding matrix is "favorable to mc", for 0<=mc<=m, if every T of mc faulty channels has the property that R(T) is strictly greater than R(Tp) for any Tp that strictly includes T. That is, for each channel not in T, at least one parity in R(T) hits that channel. If there are no parity errors in R(T) during a long burst, it can be concluded that the bad channels are a subset of T. The reason is as follows: Suppose the one of the channels not in T is bad. That channel hits at least one of the parities in R(T) and therefore, by (B), the chances of an error on that parity over the long burst are very high. This error however is a parity error in R(T).

As described earlier, coding matrices having mostly zero entries are preferred. This is because the fewer zeroes there are, the less likely the method will be able to distinguish between one set of error sources and another set. If too few of the entries are zeroes, it could get so bad that the coding matrix is "favorable to mc" only for mc=0, which greatly reduces the practical usefulness of the method.

Two simple examples follow from the above discussed type (5,2) near-Wiencko array with H=1 and Q=1, and the above discussed type (5,3) near-Wiencko array with H=1 and Q=2:

|   |   |   |   |   | 0 | 1 | 2 | 3 | 4-hits (5,2) |
|---|---|---|---|---|---|---|---|---|---|
| 0 | 1 | 0 | 0 | 1 | x | x |   |   | x |
| 1 | 0 | 1 | 0 | 0 | x | x | x |   |   |
| 0 | 1 | 0 | 1 | 0 |   | x | x | x |   |
| 0 | 0 | 1 | 0 | 1 |   |   | x | x | x |
| 1 | 0 | 0 | 1 | 0 | x |   |   | x | x |

|   |   |   |   |   | 0 | 1 | 2 | 3 | 4-hits (5,3) |
|---|---|---|---|---|---|---|---|---|---|
| 0 | 0 | 1 | 0 | 1 | x |   | x |   | x |
| 0 | 0 | 0 | 1 | 0 | x |   |   | x |   |
| 1 | 0 | 0 | 1 | 0 | x | x |   | x |   |
| 0 | 0 | 0 | 0 | 1 |   | x |   |   | x   s |

-continued

```
0 1 0 0 1     x x      x
1 0 0 0 0   x     x
1 0 1 0 0   x     x x
0 1 0 0 0     x       x      s
0 1 0 1 0     x       x x    s
0 0 1 0 0       x         x  r
```

In the (5, 2) case, this technique can distinguish any one-channel loss from any other. The (5,3) case is more interesting. The technique can distinguish any two-channel loss from any other in this case. For instance, marked with an r is the set R({0,1}) and with an s the set R({0,2}).

Detailed Practical Application of Codes and Algorithms for Data Storage.

Figure 14:
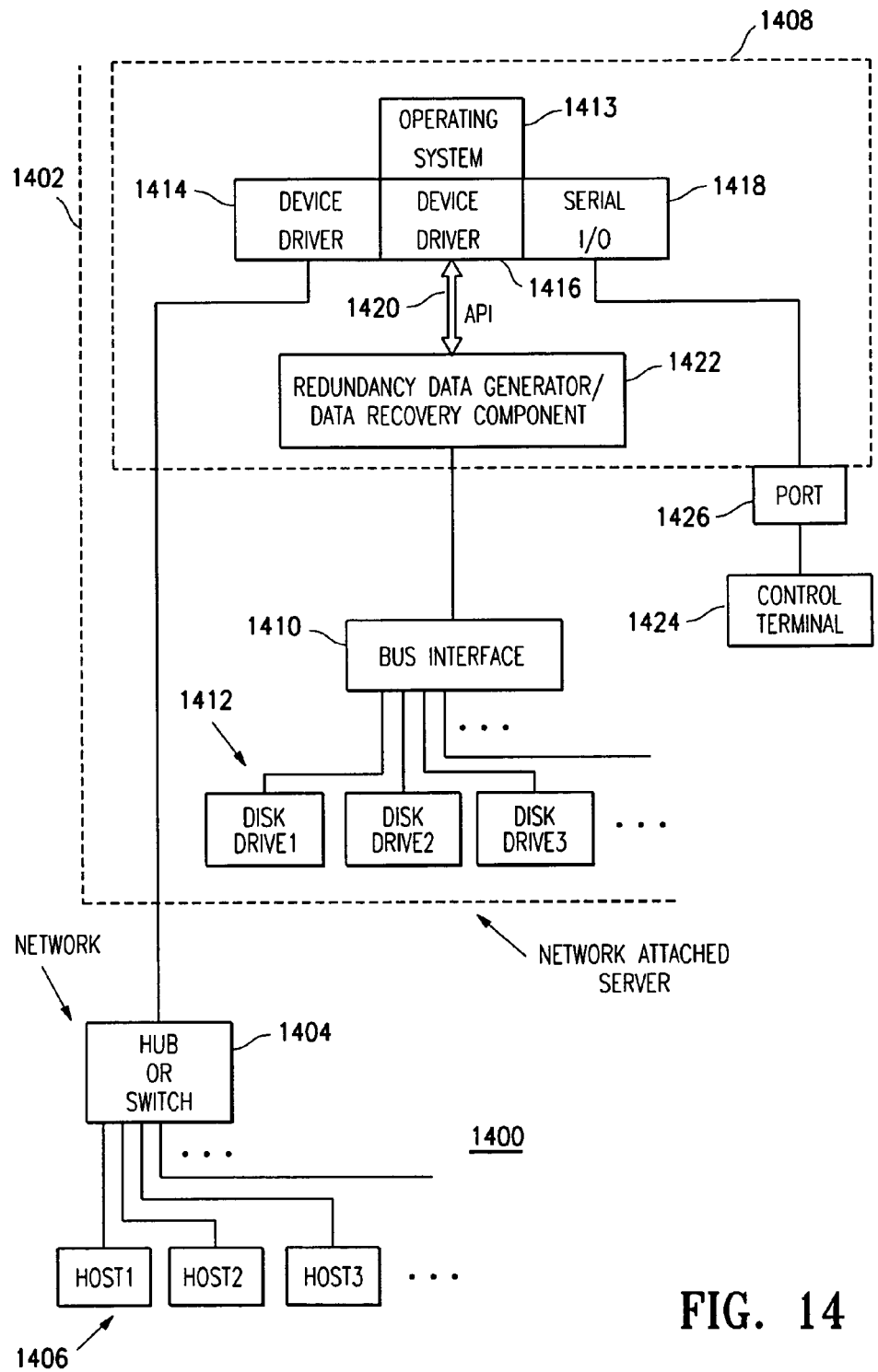
FIG. 14 is a diagram of a computer system having a redundancy data generator and data recovery component.

Referring now to FIG. 14, a block diagram of a system 1400 embodying inventive aspects is shown. System 1400 comprises a network and a network-attached server (NAS) 1402, where the network is represented in part by a hub or switch 1404 connected to a plurality of hosts 1406. NAS 1402 includes a host 1408 connected to a plurality of disk drives 1412 through a bus interface 1410. Disk drives 1412 are "packaged" in a number of preferably six, twelve, or eighteen. Host 1408 may also be connected to a control terminal 1424 through a port 1426. Bus interface 1410 may utilize any suitable bus technology, for example, Peripheral Component Interconnect (PCI), Small Computer System Interface (SCSI), Fibre Channel, or Integrated Drive Electronics (IDE). In addition, control terminal 1424 may be any suitable control device, such as a VT-100 terminal, and port may be a COM1 port. Alternatively, control terminal 1424 could be used with a Telnet connection.

Host 1408 utilizes an operating system 1413, a device driver 1414, a device driver 1416, and a serial I/O driver 1418. Host 1408 also includes a redundancy data generator/data recovery component 1422, which communicates with device driver 1416 in accordance with an Application Program Interface (API) 1420. Component 1422 also communicates with bus interface 1410 for use in connection with disk drives 1412. Operating system 1413 may be any suitable operating system, such as Disk Operating System (DOS), NT, Unix, Linux, etc. Coupled to the network, device driver 1414 may be implemented with one of a number of different technologies, such as PCI, 10/100, BaseT (high-speed Ethernet), Fiber Distributed Data Interface (FDDI), or Copper Distributed Data Interface (CDDI).

Component 1422 is operative with disk drives 1412 as described above. Component 1422 embodies inventive principles described above (and below), and provides system 1400 with the advantages. On one hand, component 1422 may provide a fixed amount of data redundancy in the system. Alternatively, component 1422 may provide for a selection or adjustment of data redundancy. Control terminal 1424 is an administrative terminal, utilized by one who has appropriate rights to control the particulars of system 1400. If component 1422 allows for adjustments to data redundancy, control terminal 1424 provides the interface to input such control data. The amount of redundancy to be provided may be in the form of the maximum number of drives that can be lost simultaneously, or some other value or indication. A user of one of hosts, 1406 may alternatively provide control data to adjust the amount of data redundancy, given the appropriate system rights and authentication.

Figure 15:
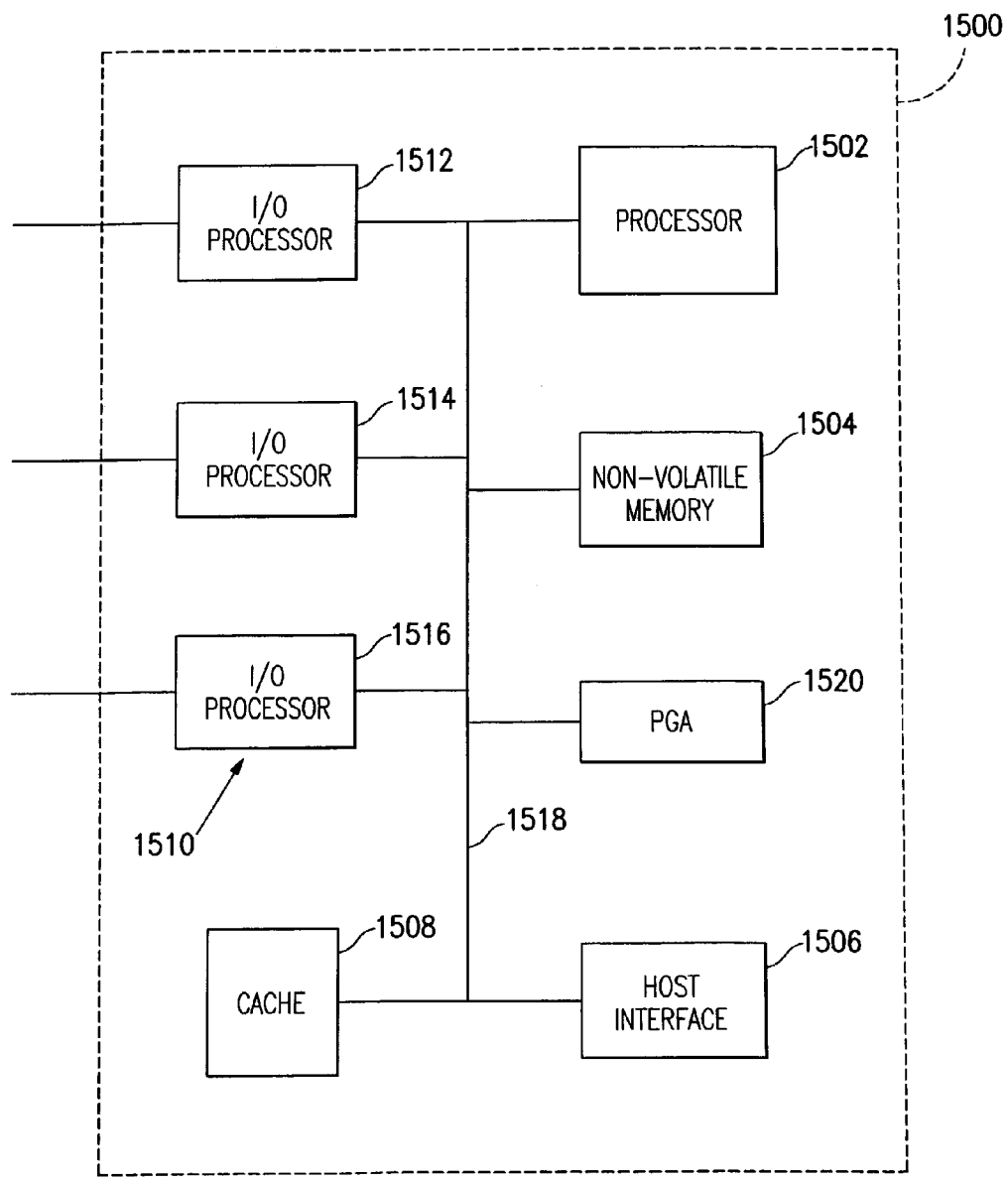
FIG. 15 is a schematic block diagram of a storage controller operative in connection with a disk array.

FIG. 15 is a schematic block diagram of a controller 1500 for a disk array. Controller 1500 includes a processor 1502, a non-volatile memory 1504, a host interface 1506, a cache 1508, and a plurality of I/O processors 1510. Non-volatile memory 1504, which may be (e.g.) a read-only memory (ROM) or electrically erasable/programmable ROM (EEPROM), has software stored therein for execution by processor 1502. The plurality of I/O processors 1510 include I/O processors 1512, 1514, and 1516, which may be (e.g.) SCSI I/O processors (SIOPs). Controller 1500 also includes circuitry which provides for redundancy data generation and data recovery as described above, and is shown as a PGA 1520. All of these components are coupled to a bus 1518.

A typical command flow for a "write" operation for controller 1500 is now described. A host issues a write command to controller 1500 to write data to a logical drive. Processor 1502 initiates a command to PGA 1520 to setup the appropriate instruction type. Processor 1502 sets up the host interface 1506 to transfer data to cache 1508. Upon completion of the transfer, host interface 1506 notifies processor 1502. Processor 1502 determines that some data may be required from SCSI disks for parity computation, and instructs the I/O processors 1510 to retrieve this data. I/O processors 1510 transfer data from the disks through PGA 1520 to cache 1508 and notify processor 1502 upon completion. Processor 1520 sends this data through PGA 1520 to thereby compute the appropriate redundancy data. Processor 1502 instructs I/O processors 1510 to transfer the data, as well as the redundancy data, to the disk drives. I/O processors 1510 transfer data from cache 1508 to the disks and notify processor 1502 upon completion. Processor 1502 in turn notifies the host.

A typical command flow for a "read" operation for controller 1500 is now described. A host issues a read command to controller 1500 to read data from a logical drive. Processor 1502 initiates a command to PGA 1520 to setup the appropriate instruction type. Processor 1502 determines that the data resides on multiple disks and instructs I/O processors 1510 to retrieve data from the disk drives to cache 1508. I/O processors 1510 transfer data from the disks through PGA 1520 to cache 1508 and notify processor 1502 upon completion. The data is transferred through PGA 1520 to either provide a "pass-through," or data recovery as described above if some disk or data is unavailable. Processor 1502 sets up host interface 1506 to transfer data from cache 1508 to system memory. Upon completion, host interface 1506 notifies processor 1502, which in turn, notifies the host.

Preferably, the data redundancy generation and the data recovery are performed using a special processor technology which allows operations to be performed simultaneously on multiple units of data. This technology is available today in the form of Multimedia Extensions (MMX) by Intel Corporation.

"Disk Loss Insurance" Adjustability. Another aspect of the invention gives users a choice of how much redundancy to have as part of a disk array. The selected redundancy is made immediately and continuously useful throughout the operational life of the disk array. It is a natural extension of traditional RAID technology, one that offers performance advantages no matter what degree of redundancy in the disk array is desired.

Referring now to FIG. 16.2, a flowchart describing a method for use in redundancy adjustability is shown. Beginning at a start block 1600, control data that is indicative of an amount of data redundancy desired in the disk array is received (step 1602). The control data is indicative of the value "m" and may take a variety of forms; for example, it may be the value in or m/n. Based on this control data, one of multiple sets of data redundancy functions (or codes) are selected (step 1604). One of multiple sets of data recovery functions (codes) is selected based on the control data (step 1606). The flowchart ends at a finish block 1608. This method may be performed once to configure the system, or may be executed each time data is stored on the disk array (FIG. 17) and each time data is read from the disk array (FIG. 18).

Referring now to FIG. 16.1, a schematic block diagram of one example of an adjustable redundancy and recovery apparatus 1610 is shown. In this example, apparatus 1610 is operative in connection with five disks (n=5) and m is adjustable.

Apparatus 1610 includes a plurality of function set components 1612 coupled to selectors 1622 and 1624. In this example, there are four function set components, namely function set components 1614, 1616, 1618, and 1620 associated with m=1, m=2, m=3, and m=4 respectively. Selectors 1622 and 1624 are operative to select one of function set components 1612 for redundancy data generation and data recovery. Redundancy control signals are fed to selectors 1622 and 1624 to establish which one of function set components 1612 are selected. Apparatus 1610 may be implemented in many suitable ways, such as with software or hardware as described in relation to FIGS. 6 and 7.

Conventional RAID Comparisons. RAID-1, "disk mirroring," allows for two disks worth of information to be copied to two other disks. RAID-1 fails, though, if the "wrong" two of the four disks fail. A "4/2" configuration allows any two of the four disks to fail while still allowing the original two disks of information to be fully recovered. Because RAID-1 solutions are costly, many databases rely strictly upon RAID-5 with striping and parity for protection against drive failure. However, RAID-5 supports continued operation only in the event of a single inoperable drive at any one moment. Losing two or more drives under RAID-5 brings operations quickly to a halt. For the cost of adding just one more drive, storage system 100 mitigates the risk of data loss by providing the means to sustain up two drive failures.

One of the better conventional protections for critical information today is accomplished through RAID-1 (mirroring), overlaying RAID-5 (striping with parity) and then adding a global hot spare. For example, if data consumes four disk drives, then reliability can be improved by replicating this data on a second "stack" of four drives. Within each stack, however, losing just one drive would make the whole database useless. To enhance reliability, each mirrored stack can be configured as an individual RAID-5 system. Since using parity adds the need for an additional drive, user data and parity information are now striped across five drives within each stack. This provides protection against the loss of a single drive within each stack. So, from an original database that required just four drives, this RAID configuration has grown to include: four drives for the original data; four drives for the mirrored data; one parity-drive (equivalent) for each stack (two in total); and one global hot spare (standby drive on which data can be rebuilt if a drive fails).

Figure 2:
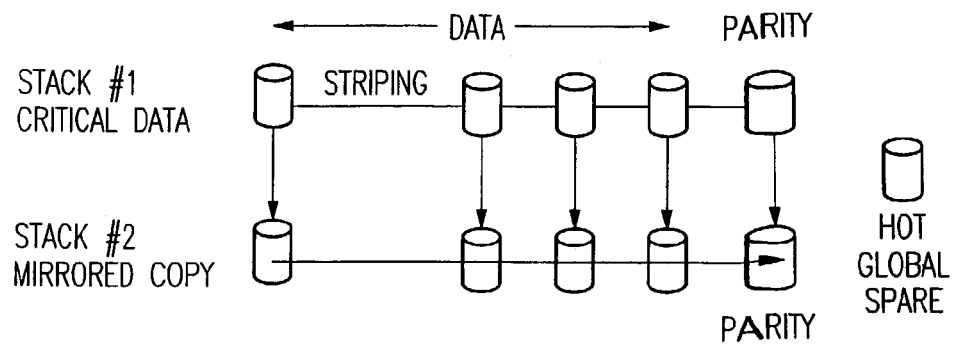
FIG. 2 is an example of a conventional RAID configuration.

Referencing back to FIG. 2, a conventional RAID architecture shown requires a total of eleven disk drives: Here, seven drives have been added to protect data on the four original drives. The configuration can recover from a failed drive in either stack. Even if all the drives in one stack failed, the remaining drives in the surviving stack would still provide access to critical data. However, in this case, only one drive failure in the remaining stack could be tolerated. If multiple drive failures occur within each stack, the data cannot be recovered.

Figure 3:
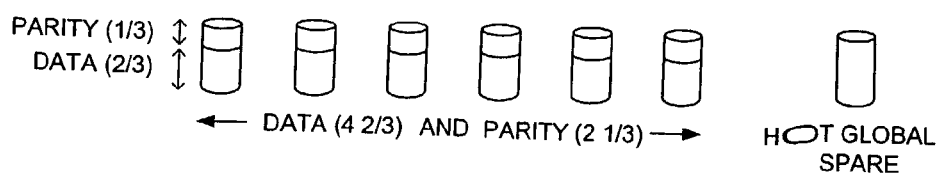
FIG. 3 is an example of an inventive configuration comparable to the conventional RAID configuration of FIG. 2.

For comparison, an exemplary configuration based on principles of the invention is shown in FIG. 3, where equal coverage against multiple drive failure is achieved. This configuration provides protection against two-drive failure, but at a much less cost and with superior performance: requires only 8 disk drives compared to 11 for traditional RAID; doesn't tax system resources by requiring double "writes"; has faster transfer rates and greater raw data capacity; requires less administrative overhead; if these disk drives cost $1,000 each, for example, the inventive apparatus saves $3,000 while providing better insurance, since any two random drives can fail and the system will continue to properly function.

An additional performance advantage of the inventive techniques is realized by converting passive "hot spares" into active contributors to the disk array. All running disks can be fully employed, which means complete utilization of all spindles for better writing and reading efficiency. This also prevents the problems of hot spares possessing latent defects, defects that might not become known until the hot spare is actively used in the array.

In a traditional RAID-1 (or 0+1, 5+1, etc.) storage configuration, with data mirrored on two independent SCSI channels, all data could be lost in one channel and operation would continue. However, if more than one drive failure concurrently occurs in both mirrored channels, then the entire storage system becomes inoperable. With a storage system according to the invention, on the other hand, multiple drive failures are sustainable.

As described, the inventive aspects are based on a pattern with the matrix designation n.m.H.Q, where n>m>0, H>0, Q>0, H*m<Q*(n−m), and n is the total disk count and m is the number of disks that can be lost. According to one aspect of the invention, any combination of up to m disks can be lost and the amount of data stored is equal to H*n/(H+Q), which can be close to the theoretical maximum when m disks are lost. The read speed is n, which is the theoretical maximum, and the write speed is H*n/(H+Q), which can be close to the theoretical maximum. Using some of these performance values, the following table compares the prior art with some inventive embodiments.

| Case | 0 + 1 | 10.2.3.1 | 10.4.1.1 | 5 + 1 | 10.3.2.1 | 5 + 5 (9disk) | 9.3.1.1 | 9.2.3.1 |
|---|---|---|---|---|---|---|---|---|
| Safe Loss Count | 1 | 2 | 4 | 3 | 3 | 3 | 3 | 2 |
| Max Loss Count | 5 | 2 | 4 | 6 | 3 | 5 | 3 | 2 |
| Data Capacity | 5 | 7.5 | 5 | 4 | 6⅔ | 4 | 4.5 | 6.75 |

-continued

| Case | 0 + 1 | 10.2.3.1 | 10.4.1.1 | 5 + 1 | 10.3.2.1 | 5 + 5 (9disk) | 9.3.1.1 | 9.2.3.1 |
|---|---|---|---|---|---|---|---|---|
| Read Speed | #5 | 10 | 10 | #5 | 10 | #3 | 9 | 9 |
| Write Speed | 5 | 7.5 | 5 | 4 | 6⅔ | 4 | 4.5 | 6.75 |

These speeds can be improved on certain specialized operating systems.

Figure 19:
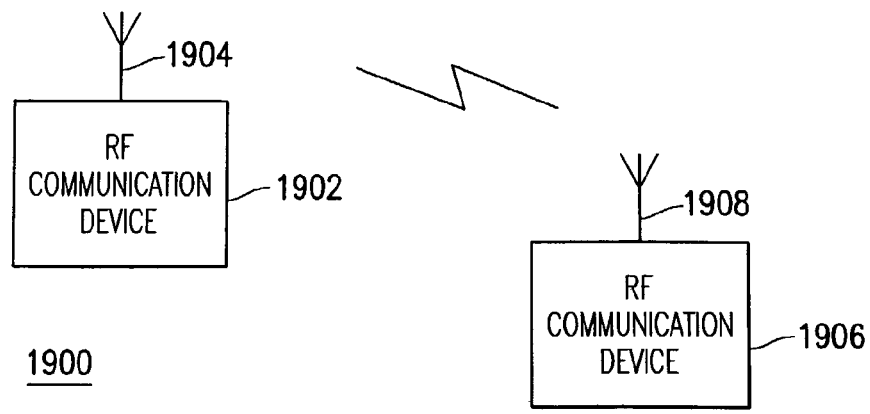
FIG. 19 is a block diagram of a communication system, which here provides for radio frequency (RF) communication.

Other Related Methods, Apparatus, and Applications. FIG. 19 is a block diagram of a communication system 1900. In this embodiment, communication system 1900 is a radio frequency (RF) communication system providing for wireless communications. Communication system 1900 includes a communication device 1902 having an antenna 1904, and a communication device 1906 having an antenna 1908. Communication devices 1902 and 1906 can be portable or non-portable electronic devices, such as portable telephones, personal digital assistants (PDAs), computers (desktop or laptop), fixed base stations, etc.

Figure 20:
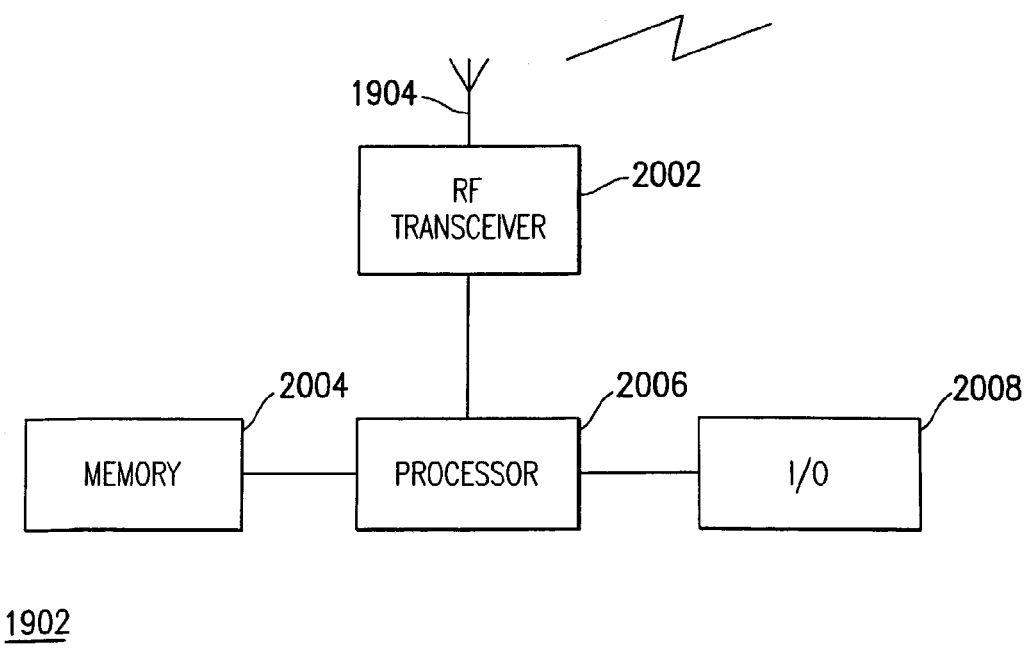
FIG. 20 is a schematic block diagram of a communication device of FIG. 19.

As shown in FIG. 20, communication device 1902 is shown to have an RF transceiver 2002 (an RF receiver and transmitter) coupled to antenna 1904, a memory 2004, a processor 2006 (or processors), and an input/output (I/O) device(s) 2008. Processor 2006 may be or include one or more microcontrollers, microprocessors, digital signal processors, etc. I/O device 2008 may be or include memory for storing and retrieving data, a speaker and/or microphone for audio communication, a display for text or video data, etc.

Generally, communication device 1902 embodies similar features as described above in relation to near-Wiencko coding and operates accordingly, and otherwise operates in a conventional manner using conventional components. The inventive components of communication device 1902 may include software and/or hardware to implement the redundancy generation and recovery functions as described above. For example, communication device 1902 may include a PGA as described above, or software stored in memory 2004 for execution by processor(s) 2006. The variables m and n may be any suitable numbers, and may remain fixed during operation.

Figure 21:
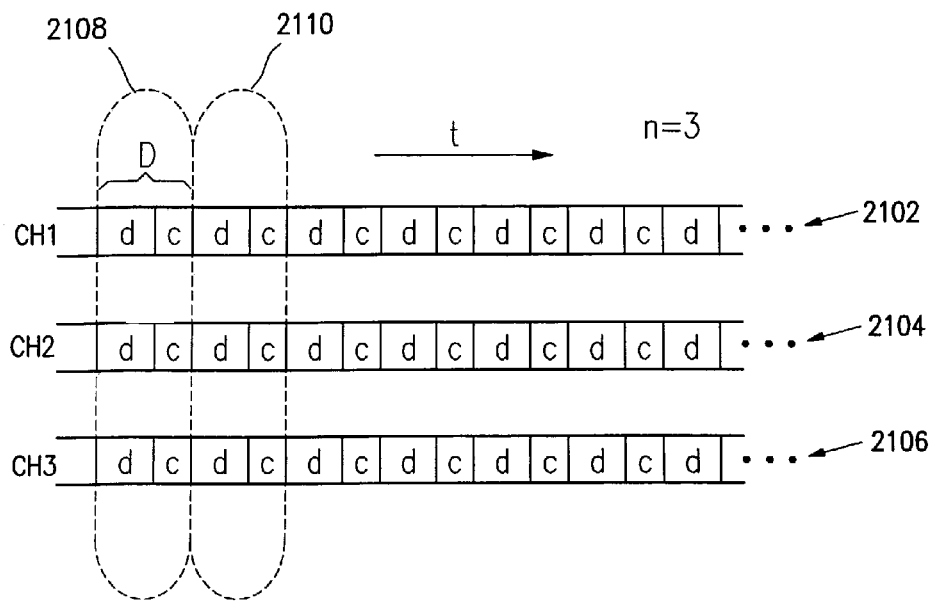
FIG. 21 is a timing/data diagram of the communication system of FIGS. 19 and 20.

FIG. 21 is a representation of a data format in communication system 1900 of FIG. 19. Variables m, n, H, Q, and D are represented and are defined similarly as above. A plurality of channels are shown, channels 1, 2, and 3 or channels 2102, 2104, and 2106, respectively. The channels may be formed using frequency division, time division, code division, etc., techniques. Since there are three channels in this example, n=3. Here, data from all three channels combine to form the user data desired. For example, a grouping 2108 from each of channels 2102, 2104, and 2106 form what would be a stripe set in a disk array. Similarly, a grouping 2110 forms what would be the next stripe set in the disk array.

Figure 22:
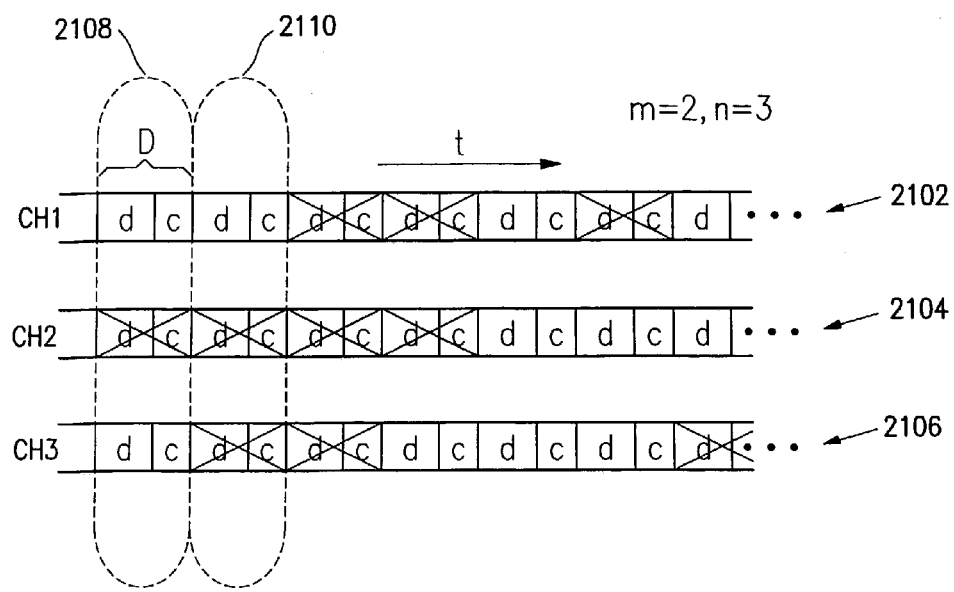
FIG. 22 is the timing/data diagram of FIG. 21, where some data portions are unavailable.

FIG. 22 is the same data format as shown in FIG. 21, but where it is established that m=2 (as an example) and that particular data groupings are unavailable (due to, e.g., data errors). The unavailability is represented by an "X" over the data that are unavailable. In accordance with the present invention, user data are recoverable when any combination of two channel failures occur (m=2). For data grouping 2108 in FIG. 22, the user data is recoverable since only a single "D" from channel two is unavailable. For the next data grouping in FIG. 22, data grouping 2110, the user data are recoverable as well since only two "D"s are unavailable (data from channels two and three). For the next data grouping in FIG. 22, the user data are partially recoverable since three "D"s from all three channels are unavailable (>m), where some data are "clear" bits. Finally, for the next data grouping in FIG. 22, the user data are recoverable since only two "D"s are unavailable (data from channels one and two). Good performance preferably involves a system in which the channel demarcations are chosen such that errors tend to concentrate in a few channels rather than be spread across many channels.

Figure 24:
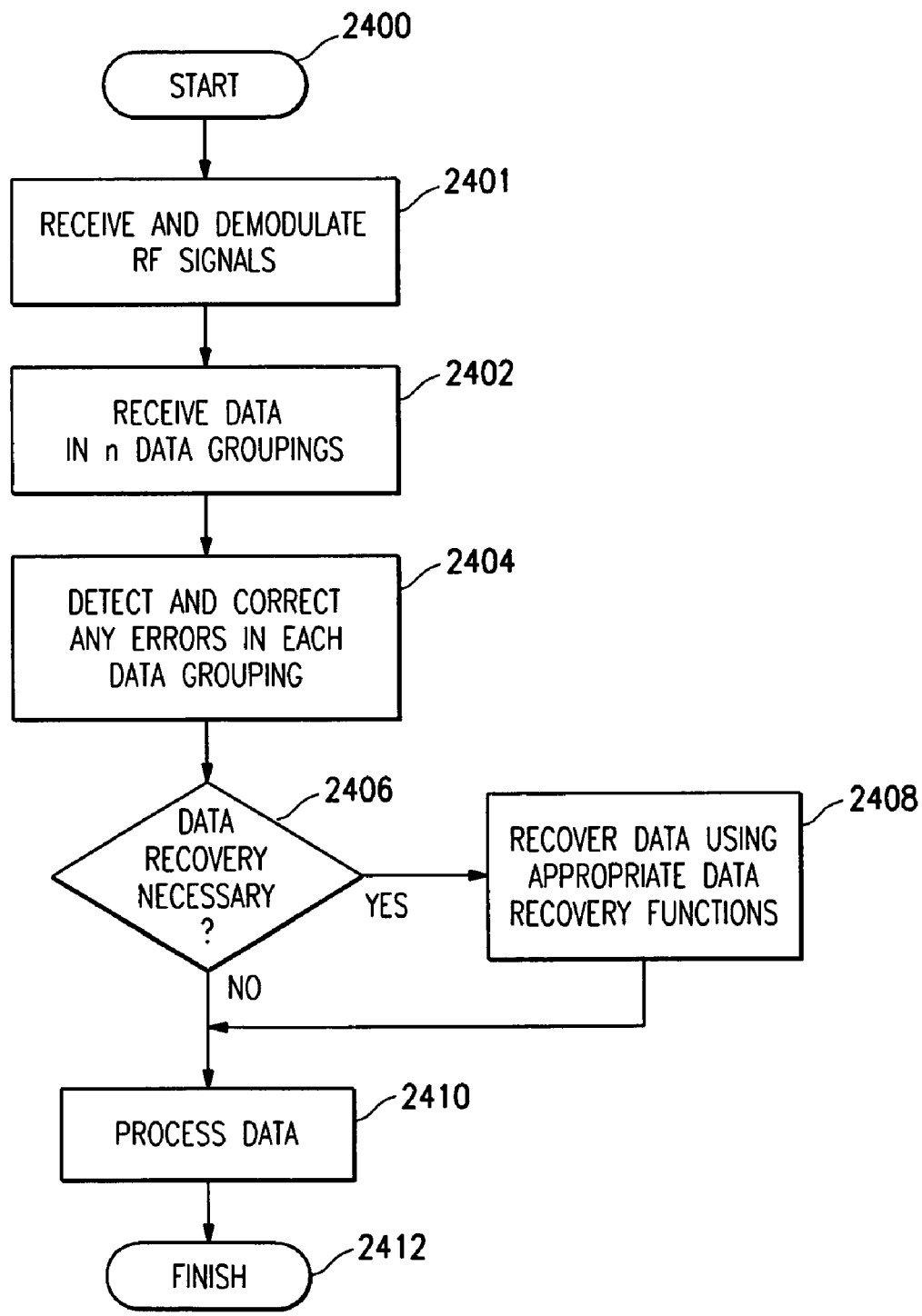
FIG. 24.1 is the timing/data diagram of FIG. 23, where some data portions are unavailable.

FIG. 23 is another example of a data format which may be utilized in connection with communication system 1900 of FIG. 19. As an example to illustrate this format, a data grouping 2302 represents what would otherwise be a stripe set in a disk array. Similarly, a data grouping 2304 represents what would otherwise be the next stripe set in the array. Referring to FIG. 24, where m=2 and n=3, the user data is recoverable in both situations shown since no more than two "time slots" in each data grouping are unavailable.

FIG. 24.1 is a flowchart describing a method of processing data in a communication device and system, such as that described in relation to FIGS. 19–24. At one or more remote stations, RF signals are modulated with the data and transmission is provided over a plurality of n channels. Beginning at a start block 2400, the modulated RF signals are received and demodulated (step 2401). The data is received in n data groupings (step 2402), some or all of which may be adversely affected with errors. For each data grouping, errors are detected and corrected to the extent possible using conventional error detection and correction techniques (e.g., with suitable conventional error detection and correction codes). Some data groupings, however, may have errors that are not correctable with use of such conventional techniques.

If data recovery is then necessary (step 2406), the data is recovered using a data recovery function(s) (step 2408). The appropriate data recovery function(s) is selected based on which data groupings are in error, even after application of conventional techniques. If no data recovery is necessary at step 2406, or after data recovery is performed at step 2408, the data is processed (step 2410). Processing the data in step 2410 may involve processing a predetermined function based on the data (e.g., for command or control data) or processing the data for use with an I/O device (e.g., for audio, text, or video data). Other suitable error detection techniques may be used in relation to steps 2404 and 2406 (e.g., low signal strength indications, low bit error rates (BER), near-Wiencko code error detection, etc.).

Communication system 1900 may also operate to provide data redundancy adjustments similar to that provided and described in relation to disk arrays. Redundancy adjustability may be provided—even dynamically during device operations. For example, communication system 1900 operates such that more redundancy is provided (i.e., m is incremented) in response to the detection of inadequate communication, and less redundancy is provided (i.e., m is decremented) otherwise. Also preferably, more redundancy is provided in response to less system capacity made available (due to, e.g., other users), and less redundancy is provided in response to more system capacity made available. The control of such adjustments may be made by the base or mobile station, or both.

Figure 25:
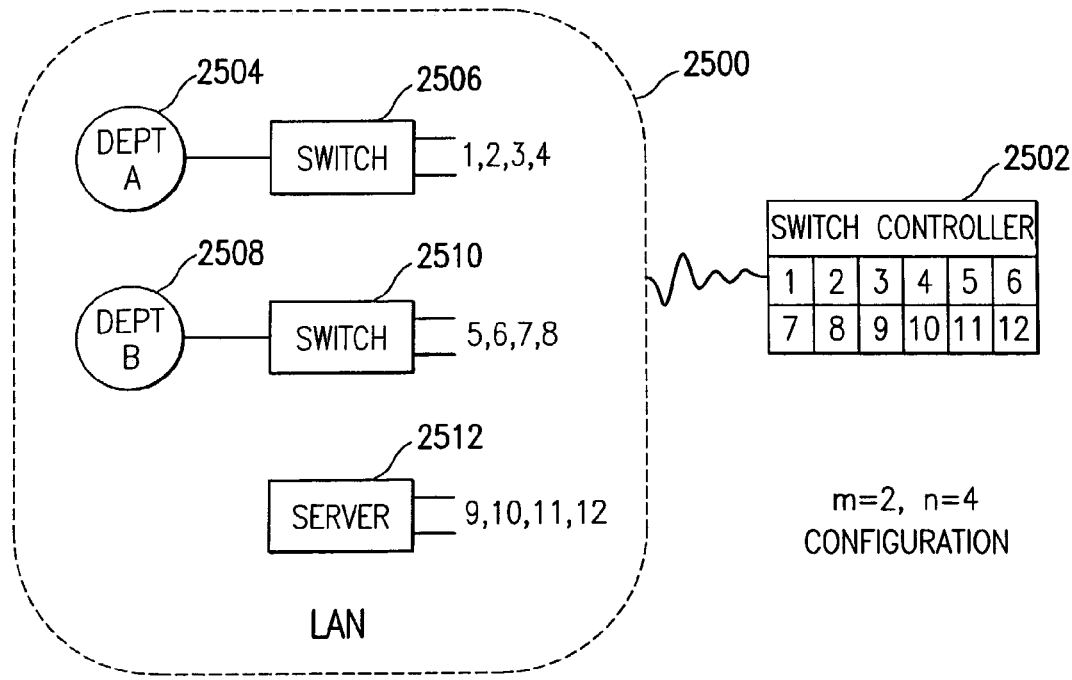
FIG. 25 is a diagram of a local area network (LAN) in communication with a switch controller.

Other inventive aspects described herein involve local area networks (LANs). FIG. 25 is a block diagram illustrating such an environment. A LAN 2500 includes a department 2504 connected to a switch 2506, a department 2508 connected to a switch 2510, and a server 2512. A switch controller 2502 has a number of ports which are connected to switches 2506, 2510 and server 2512. More particularly here, switch controller has twelve ports, the first four of which are connected to switch 2506, the second four of which are connected to switch 2510, and the last four of which are connected to server 2512.

Generally, the LAN and the entire system in FIG. 25 embody similar features as described above in relation to near-Wiencko coding and operate accordingly, but otherwise operate in a conventional manner using conventional components. The inventive components may include software and/or hardware to implement the redundancy and recovery functions, as described above. For example, switches 2506, 2510 and server 2512, as well as switch controller 2502, may include a PGA as described above, or software stored in memory for execution by a processor. As shown in FIG. 25, the system is configured for the situation where m=2 and n=4. The variables m and n may be any suitable numbers, and may remain fixed during operation. Redundancy adjustments may be provided as well, similar to that described above.

Figure 26:
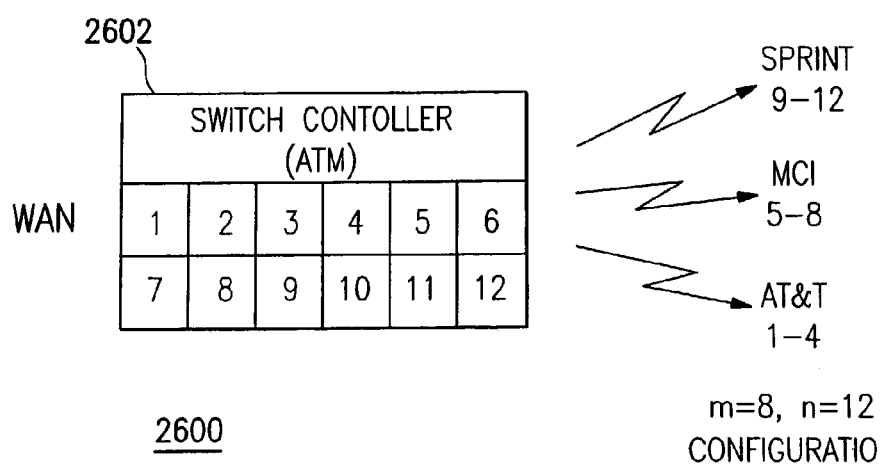
FIG. 26 is a diagram of a wide area network (WAN) in communication with telephone carriers.

Other inventive aspects described herein involve wide area networks (WANs). FIG. 26 is a block diagram illustrating such an environment. As shown, a WAN 2600 includes a switch controller 2602 connected to one or more telephone companies (as shown, AT&T, MCI, and Sprint). More particularly, switch controller 2602 has twelve ports, the first four of which are connected to AT&T, the second four of which are connected to MCI, and the last four of which are connected to Sprint.

Generally, the WAN and the entire system in FIG. 26 embodies similar features described above in relation to near-Wiencko coding and operates accordingly, and otherwise operates in a conventional manner using conventional components. The inventive components may include software and/or hardware to implement the redundancy and recovery functions, as described above. For example, switch controller 2602 and the service companies, may utilize a PGA as described above, or software stored in memory for execution by a processor. As shown in FIG. 25, the system is configured for the situation where m=8 and n=12. The variables m and n may be any suitable numbers, and may remain fixed during operation. Redundancy adjustments may be provided as well, similar to that described above.

Figures 27, 28, 29, 30:
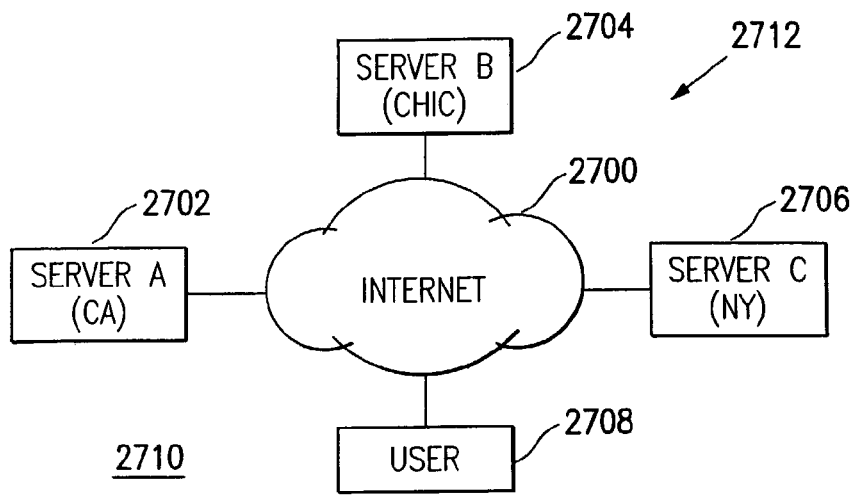
FIG. 27 is a computer network having multiple servers.
FIG. 28 is a first table showing data reception times of the computer network of FIG. 27.
FIG. 29 is a second table showing data reception times of the computer network of FIG. 27.
FIG. 30 is a third table showing data reception times of the computer network of FIG. 27.

Other inventive aspects described herein involve multiple servers, or multiple servers and the Internet. FIG. 27 is a diagram illustrating such an environment. A system 2710 includes a plurality of servers 2712, such as servers 2702, 2704, and 2706. Servers 2712 may be connected via the Internet 2700. An end user 2708 may connect to the Internet 2700 to access data from one or more of servers 2712.

Generally, system 2710 embodies similar features as described above in relation to near-Wiencko coding and operates accordingly, and otherwise operates in a conventional manner using conventional components. The data is spread over multiple servers in a manner similar to that described in relation to a disk array. The inventive components may include software and/or hardware to implement the redundancy and recovery functions, as described above. For example, servers 2712 and user 2708 may operate in connection with a PGA as described above, or software stored in memory for execution by a processor. The variables m and n may be any suitable numbers, and may remain fixed during operation. Redundancy adjustments may be provided as well, similar to that described above.

In an alternate embodiment, system 2710 may operate using a "temporal proximity" technique. The data is spread over the multiple servers in a manner similar to that described in relation to a disk array. To illustrate, suppose m=2 and n=3, and that servers 2712 are geographically separated by some large distance. For example, server 2702 (designated "A") is located in California, server 2704 (designated "B") is located in Chicago, Ill., and server 2706 (designated "C") is located in New York. At different times of the day, servers 2712 are loaded differently. Therefore, when user 2708 requests data from any one of servers 2712, the time it takes to retrieve that data depends upon which server is accessed. Exemplary differences in data access time from servers 2712 are summarized in the tables of FIGS. 28, 29, and 30. As shown in these tables, data access time is best from server 2702 at 7:30 a.m., from server 2704 at 8:30 a.m., and from server 2706 at 11:30 a.m.

In operation, user 2708 sends a request for some information (e.g., a file) from each one of servers 2712. In response to the requests, servers 2712 operate in a parallel fashion to submit data from the file to user 2708. Eventually, one of servers 2702 will be the first to supply user 2708 with the data (i.e., packet or group of packets). Once user 2708 receives the data from the first "winning" server, it ignores the other data submitted by the "losing" server(s). Since m=2 and n=3, user 2708 can afford to ignore this later sent data and recover the data using the techniques described herein. This method repeats for each packet or group of packets. Thus, in this embodiment, data is always made "available" from a single server.

Figure 31:
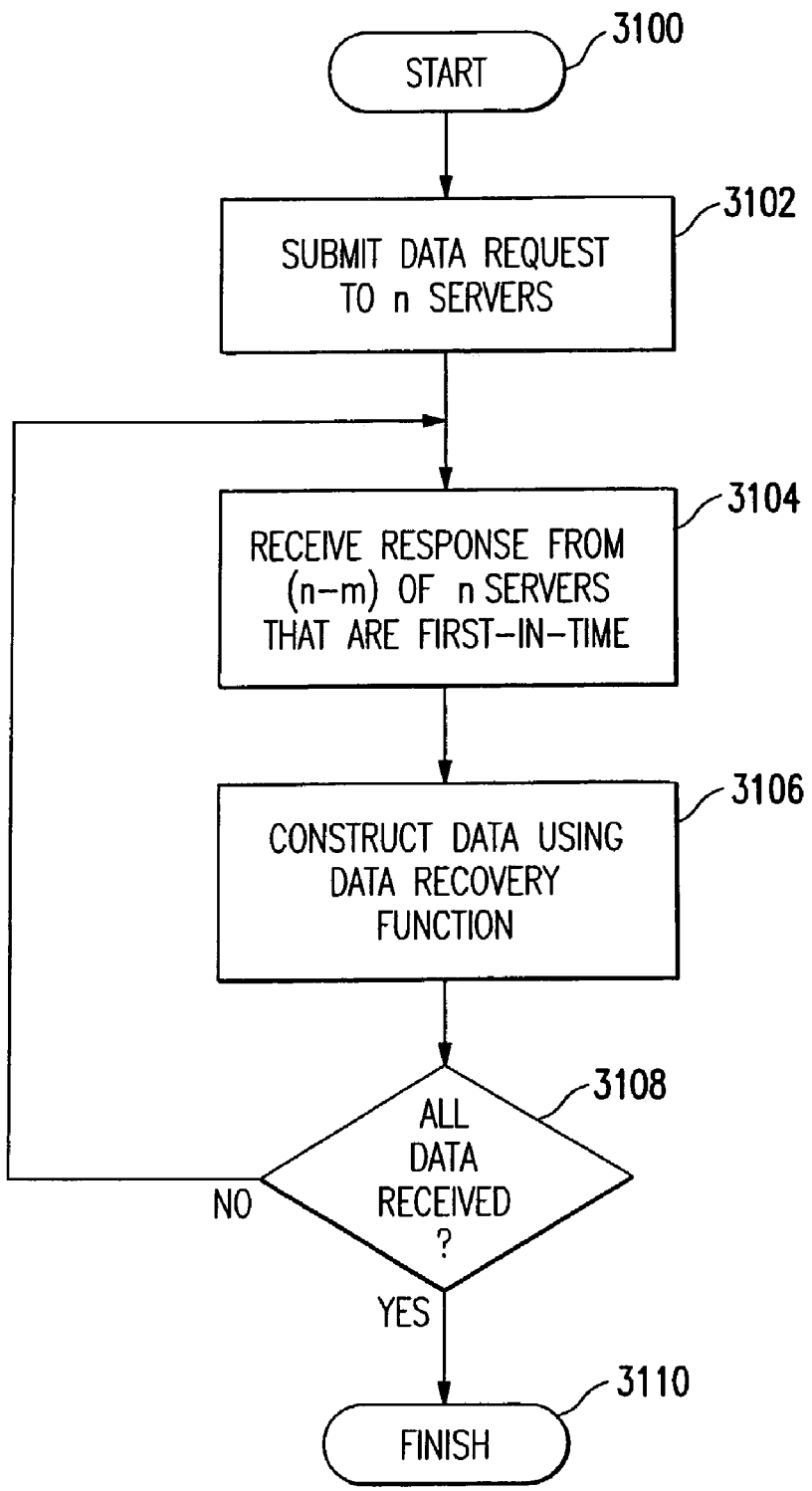
FIG. 31 is a flowchart describing a method of data communication of the computer network of FIG. 27.

FIG. 31 is a flowchart describing a method of processing data in accordance with such temporal proximity techniques. Assume m=n-1. Beginning at a start block 3100, a data request is submitted to n servers (step 3102). A response is received from one of n servers that is first in time (step 3104). The data is constructed using a near-Wiencko data recovery function and that received from the first responding server (step 3106). The appropriate data recovery function is selected based on which server first responded. Responses from the other n−1 servers that are later in time may be ignored. If it is determined that all data have been received (step 3108), the flowchart ends at a finish block 3110 (but the method may repeat for subsequent requests). If all of the data have not been received, the method repeats at step 3104. This technique may be used in connection with values of m that are less than n−1 as well, where the first (n−m) responses are used to construct the data.

In another embodiment related to FIG: 31, step 3104 receives a response that is both first-in-time and error-free (based on the use conventional error detection and/or correction techniques). Here, for example, the first-in-time response may have non-correctable errors, but the second-in-time response may have no errors and therefore be used to recover the data in its entirety.

Further Related Methods, Apparatus, and Applications. Parity in memory and low level storage is intimately connected with low-level hardware and firmware so as to be transparent and not costly from the point of view of all data using applications including drivers. It is usually accomplished on the bit-level before the data is assembled into bytes or words. Though closely related to RAID, there are some differences: RAID must be able to operate as an overlay on any disks (or other storage devices) independent of the hardware, firmware or memory structure. It may also handle data in comparatively large blocks to avoid data access inefficiency, or in small blocks to avoid latency.

File and system copying and backup have a relationship with mirroring and RAID-1 because a copy is made. However, RAID must be available at all times to recover on-the-fly from device loss. Backups are periodic in order to avoid overburdening the system: they therefore can return data that is out-of-date. But what they do return is unlimited by the nature of the failure which can be total, unlike RAID.

Similar methods and apparatus may also be utilized to create a real-time backup capability that works in a fundamentally different way than present backup capabilities. Present "tape backup" schemes are an all-or-nothing proposition, and fail to accommodate the cases where a real-time backup, but not complete backup, is what fits the application. This application extends the RAID field in the system beyond that of the homogeneous disks. As an example, consider an 18-disk disk array, along with 5 additional storage elements, say 5 tape drives. The encoding may be setup for a "23/7" configuration, so that the equivalent of 16 disks worth of information is being stored. Here, the disk array's information alone would be sufficient to read all data, including if up to two disks failed in the disk array. If up to five additional disks failed, then data is still recoverable with a little help from the tape drives.

In the exemplary case, the risk of losing all data if more than seven disks fail may be acceptable, but the backup capability may need to be updated in real-time. A downside to this approach is that decode is always necessary, because access to the slower tape drives when at least sixteen disks are available is never desired, and decode must be performed for five elements even when all eighteen disks are available. However, this downside can be ameliorated using fast-acting decode logic.

The example above applies techniques to disks and tape. However, the techniques may be applied to faster disks and slower disks, or a number of levels of faster, fast, moderate, slow, slower storage technologies, whether they be semiconductor, rotating media or streaming media. The parallel-element redundancy techniques of the present invention can be applied to systems employing a mixture of these media.

With code searching methods, near-Wiencko encoding matrices have been found for many pairs of n and m. Appendix A contained on a compact disc that has been incorporated by reference provides an exemplary list of currently available near-Wiencko codes. Since multiple instances of near-Wiencko codes exist for many pairs of m and n, those with the most favorable implementation characteristics (smaller data and code chunk sizes, sparseness of encoding matrix) have been selected for inclusion.

Further description of near-Wiencko code discovery and/or validation method is provided as source code and documentation in Appendix B contained on the compact disc.

By way of summary, the present disclosure describes the near-Wiencko technique and its application to various areas of technology such as disk arrays, RAID-like arrays of tape drives or optical devices, storage devices having connected storage modules (e.g. FIG. 14), communication systems (e.g. FIG. 20), networked devices in a LAN or WAN environment (e.g. FIGS. 25 and 26), networked servers (e.g. FIG. 27), etc. In the appended claims, the term "data channels" may be understood to generically refer to the individual devices in these systems, such as a disk, tape, storage module, communication channel, networked device, server, etc., or a subpart of such a device such as a part of a disk. The phrase "providing data to a data channel" may be understood to generally include writing data, storing data, transmitting data, communicating data, etc. to a data channel; and "retrieving data from a data channel" may be understood to generally include reading data, retrieving data, receiving data, etc. from a data channel.

As readily apparent, the various inventive aspects described herein provide several advantages in simplicity and constitutes a breakthrough and a technological leap in the arts, as in the fields of data redundancy generation and recovery, data retrieval and storage, data communications, and network operations. The present invention is a particular breakthrough in the field of RAID architecture, which has long used rather limited techniques. Thus, the scope of all of the claimed inventions should be understood to be quite broad and warrant a broad range of equivalent structures and functionalities.

What is claimed is:

1. A method for controlling a data storage apparatus including a plurality of n storage devices, the method comprising:

selecting a control value m indicative of a degree of data redundancy, m being an integer variable from the group consisting of 1 to n−1 inclusive;

logically configuring each storage device into one or more stripes, each stripe including H data portions for storing user data and Q data redundancy portions for storing redundancy data, H and Q being positive integers and H/Q<(n−m)/m; and providing a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and the redundancy data stored in n−m remaining storage devices using the data recovery functions.

2. The method of claim 1, further comprising:

generating redundancy data from user data using the data redundancy function;

storing the user data in the data portions of the storage devices;

storing the redundancy data in the data redundancy portions of the storage devices; and when any subset of m or fewer storage device is unavailable, recovering user data stored in the unavailable storage devices from the user data and redundancy data stored in n−m remaining storage devices using a data recovery function, the data recovery function being selected from the set of data recovery functions based on identities of the unavailable storage devices.

3. The method of claim 1, wherein the data redundancy function is represented by an n*H by n*Q encoding bit matrix which is representable by an n by n array of H by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

4. The method of claim 3, wherein the redundancy data is generated by multiplying the user data by the encoding bit matrix, and wherein the data stored in unavailable storage devices is recovered by multiplying the user data stored in n−m remaining storage devices by the encoding bit matrix, subtracting the multiplication result to the redundancy data stored in the n−m remaining storage devices, and applying a solution matrix of the corresponding composite submatrix to the subtraction result.

5. The method of claim 1, wherein the data redundancy function and the set of data recovery functions are selected from a plurality of pre-stored data redundancy functions and data recovery functions.

6. A data storage apparatus comprising:
a plurality of n storage devices; and
a storage controller for controlling writing and reading data to and from the storage devices, the controller having stored program instructions or a logic circuit operable to
select a control value m indicative of a degree of data redundancy, m being an integer variable from the group consisting of 1 to n−1 inclusive,
logically configure each storage device into one or more stripes, each stripe including H data portions for storing user data and Q data redundancy portions for storing redundancy data, H and Q being positive integers and H/Q<(n−m)/m,
generate redundancy data from the user data using a data redundancy function obtained based on the value n and the control value m,
store the user data in the data portions of the storage devices, store the redundancy data in the data redundancy portions of the storage devices, and
when any subset of m or fewer storage devices is unavailable, recover user data stored in the unavailable storage devices from the user data and redundancy data stored in n−m remaining storage devices using a corresponding data recovery function.

7. The data storage apparatus of claim 6, wherein each storage device is a disk or tape or a part thereof.

8. The data storage apparatus of claim 6, wherein the data redundancy function is represented by an n*H by n*Q encoding bit matrix which is representable by an n by n array of H by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

9. The data storage apparatus of claim 8, wherein the redundancy data is generated by multiplying the user data by the encoding bit matrix, and wherein the data stored in unavailable storage devices is recovered by multiplying the user data stored in n−m remaining storage devices by the encoding bit matrix, subtracting the multiplication result to the redundancy data stored in the n−m remaining storage devices, and applying a solution matrix of the corresponding composite submatrix to the subtraction result.

10. The data storage apparatus of claim 6, wherein the data redundancy function and the set of data recovery functions are selected from a plurality of pre-stored data redundancy functions and data recovery functions.

11. The data storage apparatus of claim 6, wherein the plurality of storage devices and the storage controller are connected via a communications network.

12. A method for controlling a data storage apparatus comprising a plurality of n storage devices, the method comprising:
logically configuring each storage device into one or more stripes, each stripe including H data portions for storing user data and Q data redundancy portions for storing redundancy data, H and Q being positive integers and H/Q<(n−m)/m, wherein m is a control value indicative of a degree of data redundancy and an integer between 2 and n−1 inclusive; and
providing a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and redundancy data stored in n−m remaining storage devices using the data recovery functions.

13. The method of claim 12, further comprising:
generating redundancy data from user data using the data redundancy function;
storing the user data in the data portions of the storage devices;
storing the redundancy data in the data redundancy portions of the storage devices; and
when any subset of m or fewer storage device is unavailable, recovering user data stored in the unavailable storage devices from the user data and redundancy data stored in n−m remaining storage devices using a data recovery function, the data recovery function being selected from the set of data recovery functions based on identities of the unavailable storage devices.

14. The method of claim 12, wherein the data redundancy function and the set of data recovery functions are selected from a plurality of pre-stored data redundancy functions and data recovery functions.

15. A method for controlling a data storage apparatus comprising a plurality of n storage devices, the method comprising:
logically configuring each storage device into one or more stripes, each stripe including H data portions for storing user data and Q data redundancy portions for storing redundancy data, H and Q being positive integers and H/Q<(n−m)/m, wherein m is a control value indicative of a degree of data redundancy and an integer between 1 and n−1 inclusive; and
providing a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and redundancy data stored in n—m remaining storage devices using the data recovery functions,
wherein the data redundancy function is represented by an n*H by n*Q encoding bit matrix which is representable by an n by n array of HI by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

16. The method of claim 15, wherein the redundancy data is generated by multiplying the user data by the encoding bit matrix, and wherein the data stored in unavailable storage devices is recovered by multiplying the user data stored in n−m remaining storage devices by the encoding bit matrix, subtracting the multiplication result to the redundancy data stored in the n−m remaining storage devices, and applying a solution matrix of the corresponding composite submatrix to the subtraction result.

17. An apparatus useful for generating redundancy data, comprising:
a storage medium or a logic circuit; and
code embedded in the storage medium or the logic circuit, the code being represented by an n*H by n*Q encoding bit matrix which is representable by an n by n array of H by Q submatrices, n, H and Q being positive integers and H/Q<(n−m)/m, m being an integer between 1 and n−1 inclusive, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

18. The apparatus of claim 17, wherein the logic circuit is a programmable gate array, and the code is embedded in logic gates configured to execute a set of XOR- and AND-based functions.

19. A method for generating redundant data from user data, comprising:
generating an n*H by n*Q encoding bit matrix, n, H and Q being positive integers and H/Q<(n−m)/m, m being an integer between 1 and n−1 inclusive; and
generating redundant data by multiplying user data by the encoding bit matrix,
wherein the step of generating the encoding bit matrix comprises:
(a) generating an n*H by n*Q candidate matrix represented by an n by n array of H by Q submatrices;
(b) selecting a set of m columns of the n by n array;
(c) forming an m*H by (n−m)*Q composite submatrix of the candidate matrix from the H by Q submatrices located at the intersection of the set of m columns of the n by n array and (n−m) rows of the n by n array that correspond to the (n−m) columns not included in the set of m columns;
(d) determining whether the composite submatrix is of maximal rank;
(e) if the composite submatrix is not of maximal rank in step (d), repeating steps (a) to (d) for another candidate matrix;
(f) if the composite submatrix is of maximal rank in step (d), repeat steps (b) to (d) for another set of m columns until all possible sets of m columns are selected; and
(g) if all possible composite submatrices for a candidate matrix are of maximal rank, select the candidate matrix as the encoding bit matrix.

20. A method for providing user data to or retrieving user data from a plurality of n data channels, comprising:
selecting a control value m indicative of a degree of data redundancy, m being an integer variable from the group consisting of 1 to n−1 inclusive;
generating redundancy data from user data using a data redundancy function obtained based on the value n and the control value m; and
providing the user data to H data portions and the redundancy data to Q data redundancy portions of each data channel, H and Q being positive integers and H/Q<(n−m)/m,
wherein the data redundancy function is such that the user data provided to any subset of m or fewer unavailable data channels is recoverable from the user data and redundancy data provided to n−m remaining data channels using a set of data recovery functions corresponding to the data redundancy function.

21. The method of claim 20, further comprising:
retrieving user data from the data channels; and
when any subset of m or fewer data channels is unavailable, recovering user data provided to the unavailable data channels from the user data and redundancy data provided to n−m m remaining data channels using a data recovery function, the data recovery function being selected from the set of data recovery functions based on identities of the unavailable data channels.

22. The method of claim 21, wherein the data channels are communication channels, wherein providing data to the data channel include transmitting data over the communication channels, and wherein retrieving data from the data channels includes receiving data over the communication channels.

23. The method of claim 22, wherein the control value is dynamically selected.

24. The method of claim 21, wherein the data redundancy function and the set of data recovery functions are selected from a plurality of pre-stored data redundancy functions and data recovery functions.

25. The method of claim 20, wherein the data redundancy function is represented by an n*H by n*Q encoding bit matrix which is representable by an n by n array of H by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

26. In a system for providing data to and retrieving data from a plurality of n data channels, the data provided to each data channel comprising user data provided to H data portions and redundancy data provided to Q data redundancy portions, m being a value indicative of a degree of data redundancy and an integer from 2 to n−1 inclusive, the redundancy data having been generated from the user data using a data redundancy function capable of recovering from the loss of any m or fewer known channels, a method of detecting faulty data channels comprising:
retrieving user data and redundancy data from each data channel;
generating expected redundancy data from the retrieved user data using the data redundancy function; and
estimating which data channels are faulty by comparing the expected redundancy data with the retrieved redundancy data.

27. In a system for providing data to and retrieving data from a plurality of n data channels, the data provided to each data channel comprising user data provided to H data portions and redundancy data provided to Q data redundancy portions, m being a value indicative of a degree of data redundancy and an integer from 1 to n−1 inclusive, the redundancy data having been generated from the user data using a data redundancy function capable of recovering from the loss of any m or fewer known channels, a method of detecting faulty data channels comprising:

retrieving user data and redundancy data from each data channel;

generating expected redundancy data from the retrieved user data using the data redundancy function; and estimating which data channels are faulty by comparing the expected redundancy data with the retrieved redundancy data, wherein the data channels are susceptible to burst errors, wherein the data redundancy function is represented by an n*H by n*Q encoding bit matrix which is representable by an n by n array of H by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank, and wherein the estimating step comprises identifying a pattern of the data redundancy portions of the data channels that exhibit discrepancies between the expected and the retrieved redundancy data, and comparing the identified pattern with a pattern of the encoding bit matrix.

28. A computer program product comprising a computer usable medium having a computer readable code embodied therein for controlling a data storage apparatus including a plurality of n storage devices, the computer program product comprising:

first computer readable program code configured to cause the data storage apparatus to select a control value m indicative of a degree of data redundancy, m being an integer variable from the group consisting of 1 to n−1 inclusive;

second computer readable program code configured to cause the data storage apparatus to logically configure each storage device into one or more stripes, each stripe including H data portions for storing user data and Q data redundancy portions for storing redundancy data, H and Q being positive integers and H/Q<(n−m)/m; and third computer readable program code configured to provide a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and redundancy data stored in n−m remaining storage devices using the data recovery functions.

29. The computer program product of claim 28, further comprising:

fourth computer readable program code configured to cause the data storage apparatus to generate redundancy data from user data using the data redundancy function;

fifth computer readable program code configured to cause the data storage apparatus to store the user data in the data portions of the storage devices;

sixth computer readable program code configured to cause the data storage apparatus to store the redundancy data in the data redundancy portions of the storage devices; and seventh computer readable program code configured to cause the data storage apparatus, when any subset of m or fewer storage device is unavailable, to recover user data stored in the unavailable storage devices from the user data and redundancy data stored in n−m remaining storage devices using a data recovery function, the data recovery function being selected from the set of data recovery functions based on identities of the unavailable storage devices.

30. The computer program product of claim 28, wherein the data redundancy function is represented by an n*H by n*Q encoding bit matrix which is representable by an n by n array of H by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

31. The computer program product of claim 30, wherein the fourth computer readable program code includes code configured to multiply the user data by the encoding bit matrix to generate the redundancy data, and wherein the seventh computer readable program code includes code configured to multiply the user data stored in n−m remaining storage devices by the encoding bit matrix, to subtract the multiplication result from the redundancy data stored in the n−m remaining storage devices, and to apply a solution matrix of the corresponding composite submatrix to the subtraction result to recover the user data stored in the unavailable storage devices.

32. The computer program product of claim 28, wherein the data redundancy function and the set of data recovery functions are selected from a plurality of pre-stored data redundancy functions and data recovery functions.

33. A data storage apparatus comprising:

a plurality of n storage devices; and a storage controller for controlling writing and reading data to and from the storage devices, the controller having stored program instructions or a logic circuit operable to logically configure each storage device into one or more stripes, each stripe including H data portions for storing user data and Q data redundancy portions for storing redundancy data, H and Q being positive integers and H/Q<(n−m)/m, wherein m is a control value indicative of a degree of data redundancy and an integer between 2 and n−1 inclusive, generate redundancy data from the user data using a data redundancy function obtained based on the value n and the control value m, store the user data in the data portions of the storage devices, store the redundancy data in the data redundancy portions of the storage devices, and when any subset of m or fewer storage devices is unavailable, recover user data stored in the unavailable storage devices from the user data and redundancy data stored in n−m remaining storage devices using a corresponding data recovery function.

34. The data storage apparatus of claim 33, wherein each storage device is a disk or tape or a part thereof.

35. The data storage apparatus of claim 33, wherein the data redundancy function and the set of data recovery functions are selected from a plurality of pre-stored data redundancy functions and data recovery functions.

36. The data storage apparatus of claim 33, wherein the plurality of storage devices and the storage controller are connected via a communications network.

37. A data storage apparatus comprising:
a plurality of n storage devices; and
a storage controller for controlling writing and reading data to and from the storage devices, the controller having stored program instructions or a logic circuit operable to
logically configure each storage device into one or more stripes, each stripe including H data portions for storing user data and Q data redundancy portions for storing redundancy data, H and Q being positive integers and $H/Q \leq (n-m)/m$, wherein m is a control value indicative of a degree of data redundancy and an integer between 1 and n−1 inclusive,
generate redundancy data from the user data using a data redundancy function obtained based on the value n and the control value m,
store the user data in the data portions of the storage devices,
store the redundancy data in the data redundancy portions of the storage devices, and
when any subset of m or fewer storage devices is unavailable, recover user data stored in the unavailable storage devices from the user data and redundancy data stored in n−m remaining storage devices using a corresponding data recovery function,
wherein the data redundancy function is represented by an n*H by n*Q encoding bit matrix which is representable by an n by n array of H by Q submatrices, wherein the encoding bit matrix has a plurality of $n!/(m!*(n-m)!)$ composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

38. The data storage apparatus of claim 37, wherein the redundancy data is generated by multiplying the user data by the encoding bit matrix, and wherein the data stored in unavailable storage devices is recovered by multiplying the user data stored in n−m remaining storage devices by the encoding bit matrix, subtracting the multiplication result to the redundancy data stored in the n−m remaining storage devices, and applying a solution matrix of the corresponding composite submatrix to the subtraction result.

39. A computer program product comprising a computer usable medium having a computer readable code embodied therein for controlling a data storage apparatus including a plurality of n storage devices, the computer program product comprising:
first computer readable program code configured to cause the data storage apparatus to logically configure each storage device into one or more stripes, each stripe including H data portions for storing user data and Q data redundancy portions for storing redundancy data, H and Q being positive integers and $H/Q \leq (n-m)/m$, wherein m is a control value indicative of a degree of data redundancy and an integer between 2 and n−1 inclusive; and
second computer readable program code configured to cause the data storage apparatus to provide a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and redundancy data stored in n−m remaining storage devices using the data recovery functions.

40. The computer program product of claim 39, further comprising:
fourth computer readable program code configured to cause the data storage apparatus to generate redundancy data from user data using the data redundancy function;
fifth computer readable program code configured to cause the data storage apparatus to store the user data in the data portions of the storage devices;
sixth computer readable program code configured to cause the data storage apparatus to store the redundancy data in the data redundancy portions of the storage devices; and
seventh computer readable program code configured to cause the data storage apparatus, when any subset of m or fewer storage device is unavailable, to recover user data stored in the unavailable storage devices from the user data and redundancy data stored in n−m remaining storage devices using a data recovery function, the data recovery function being selected from the set of data recovery functions based on identities of the unavailable storage devices.

41. The computer program product of claim 39, wherein the data redundancy function and the set of data recovery functions are selected from a plurality of pre-stored data redundancy functions and data recovery functions.

42. A computer program product comprising a computer usable medium having a computer readable code embodied therein for controlling a data storage apparatus including a plurality of n storage devices, the computer program product comprising:
first computer readable program code configured to cause the data storage apparatus to logically configure each storage device into one or more stripes, each stripe including H data portions for storing user data and Q data redundancy portions for storing redundancy data, H and Q being positive integers and $H/Q \leq (n-m)/m$, wherein m is a control value indicative of a degree of data redundancy and an integer between 1 and n−1 inclusive; and
second computer readable program code configured to cause the data storage apparatus to provide a data redundancy function and a corresponding set of data recovery functions based on the value n and the control value m, the data redundancy function being useful for generating redundancy data from user data, the data redundancy function being such that the user data stored in any subset of m or fewer unavailable storage devices is recoverable from the user data and redundancy data stored in n−m remaining storage devices using the data recovery functions, wherein the data redundancy function is represented by an n*H by n*Q encoding bit matrix which is representable by an n by n array of H by Q submatrices, wherein the encoding bit matrix has a plurality of n!/(m!*(n−m)!) composite submatrices definable therefrom, each such composite submatrix being definable from submatrices at the intersection of a unique set of m column(s) of the n by n array and (n−m) row(s) of the n by n array that correspond to those (n−m) column(s) not included in the set of m column(s), wherein each one of the composite submatrices is of maximal rank.

43. The computer program product of claim 42, wherein the fourth computer readable program code includes code configured to multiply the user data by the encoding bit matrix to generate the redundancy data, and wherein the seventh computer readable program code includes code configured to multiply the user data stored in n−m remaining storage devices by the encoding bit matrix, to subtract the multiplication result from the redundancy data stored in the n−m remaining storage devices, and to apply a solution matrix of the corresponding composite submatrix to the subtraction result to recover the user data stored in the unavailable storage devices.

* * * * *